US012633949B2

(12) United States Patent　　　　(10) Patent No.:　US 12,633,949 B2
Tahara et al.　　　　　　　　　　　　(45) Date of Patent:　　May 19, 2026

(54) RADIO FREQUENCY CIRCUIT, COMMUNICATION DEVICE, AND POWER AMPLIFICATION METHOD FOR RADIO FREQUENCY CIRCUIT

(71) Applicant: Murata Manufacturing Co., Ltd., Nagaokakyo (JP)

(72) Inventors: Kenji Tahara, Nagaokakyo (JP); Hidetaka Takahashi, Nagaokakyo (JP); Kae Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 320 days.

(21) Appl. No.: 18/432,115

(22) Filed: Feb. 5, 2024

(65) Prior Publication Data

US 2024/0178868 A1　　May 30, 2024

Related U.S. Application Data

(63) Continuation of application No. PCT/JP2022/029743, filed on Aug. 3, 2022.

(30) Foreign Application Priority Data

Aug. 12, 2021　(JP) ................................ 2021-131534

(51) Int. Cl.
*H04B 1/04*　　　　(2006.01)
*H03F 3/24*　　　　(2006.01)
*H03F 3/68*　　　　(2006.01)
(52) U.S. Cl.
CPC ................ *H04B 1/04* (2013.01); *H03F 3/24* (2013.01); *H03F 3/68* (2013.01); *H04B 2001/0408* (2013.01)

(58) Field of Classification Search
CPC ..... H04B 1/04; H04B 2001/0408; H03F 3/24; H03F 3/68; H03F 3/195; H03F 3/213; H03F 3/20
See application file for complete search history.

(56) References Cited

U.S. PATENT DOCUMENTS

2018/0241362 A1 *　8/2018　Takenaka ............... H03F 1/0288
2020/0220568 A1 *　7/2020　Watanabe ................. H03F 3/72

FOREIGN PATENT DOCUMENTS

JP　　2006-148780 A　　6/2006
JP　　2013-085179 A　　5/2013
(Continued)

OTHER PUBLICATIONS

International Search Report and Written Opinion mailed on Nov. 8, 2022, received for PCT Application PCT/JP2022/029743, filed on Aug. 3, 2022, 8 pages including English Translation.

*Primary Examiner* — Tuan H Nguyen
(74) *Attorney, Agent, or Firm* — XSENSUS LLP

(57)　　　　　ABSTRACT

A radio frequency circuit including power amplifiers, a transformer having an input-side coil and an output-side coil, a bias circuit connected to the power amplifiers, an output terminal connected to one end of the output-side coil, an output terminal connected to another end of the output-side coil, a switch connected between the output terminal and a ground, a switch connected between the output terminal and a ground, a phase shift line having an input end connected to an output terminal of the power amplifier and an output end connected to one end of the input-side coil, and a phase shift line having an input end connected to an output terminal of the power amplifier and an output end connected to another end of the input-side coil.

20 Claims, 11 Drawing Sheets

(56)          References Cited

FOREIGN PATENT DOCUMENTS

| | | | |
|---|---|---|---|
| JP | 2014-204170 | A | 10/2014 |
| JP | 2018-137566 | A | 8/2018 |
| JP | 2018-160756 | A | 10/2018 |
| WO | 2019/054176 | A1 | 3/2019 |

* cited by examiner

FIG. 1B

WHEN BAND A IS TRANSMITTED (HIGH POWER MODE)

FIG. 2B

WHEN BAND A IS TRANSMITTED (MIDDLE/LOW POWER MODE)

FIG. 3A

WHEN BAND B IS TRANSMITTED (HIGH POWER MODE)

RADIO FREQUENCY CIRCUIT, COMMUNICATION DEVICE, AND POWER AMPLIFICATION METHOD FOR RADIO FREQUENCY CIRCUIT

CROSS-REFERENCE TO RELATED APPLICATIONS

This is a continuation application of PCT/JP2022/029743, filed on Aug. 3, 2022, designating the United States of America, which is based on and claims priority to Japanese Patent Application No. JP 2021-131534 filed on Aug. 12, 2021. The entire contents of the above-identified applications, including the specifications, drawings and claims, are incorporated herein by reference in their entirety.

TECHNICAL FIELD

The present disclosure relates to a radio frequency circuit, a communication device, and a power amplification method for a radio frequency circuit.

BACKGROUND ART

Patent Document 1 discloses a radio frequency circuit (power amplification circuit) including a first amplifier (carrier amplifier) that amplifies a first signal, which is distributed from an input signal in a region where a power level of the input signal is a first level or higher, to output a second signal, a first transformer to which a second signal is input, a second amplifier (peak amplifier) that amplifies a third signal, which is distributed from an input signal in a region where a power level of the input signal is a second level or higher, the second level being higher than the first level, to output a fourth signal, and a second transformer to which the fourth signal is input.

CITATION LIST

Patent Document

Patent Document 1: Japanese Unexamined Patent Application Publication No. 2018-137566

SUMMARY OF DISCLOSURE

Technical Problem

In the radio frequency circuit disclosed in Patent Document 1, for example, between the carrier amplifier that amplifies the input signal from a low-power region to a high-power region and the peak amplifier that amplifies only the input signal in the high-power region, the carrier amplifier has a longer amplification operation time. Therefore, the carrier amplifier tends to deteriorate relatively more easily than the peak amplifier, and there is a possibility that amplification performance of the radio frequency circuit deteriorates as the carrier amplifier deteriorates.

The present disclosure is made to solve the above-described problem, and an object of the present disclosure is to provide a radio frequency circuit including a power amplifier with suppressed deterioration of amplification performance, a communication device, and a power amplification method for a radio frequency circuit.

Solution to Problem

To achieve the above object, a radio frequency circuit according to one aspect of the present disclosure includes: a first amplification element and a second amplification element; an output transformer having an input-side coil and an output-side coil; a bias circuit connected to the first amplification element and the second amplification element; a first output terminal connected to one end of the output-side coil; a second output terminal connected to another end of the output-side coil; a first switch connected between the first output terminal and a ground; a second switch connected between the second output terminal and the ground; a first phase shift circuit having an input end connected to an output terminal of the first amplification element and an output end connected to one end of the input-side coil; and a second phase shift circuit having an input end connected to an output terminal of the second amplification element and an output end connected to another end of the input-side coil.

In addition, a power amplification method for a radio frequency circuit according to one aspect of the present disclosure is a power amplification method for a radio frequency circuit including: a first amplification element and a second amplification element; an output transformer having an input-side coil and an output-side coil; a bias circuit connected to the first amplification element and the second amplification element; a first output terminal connected to one end of the output-side coil; a second output terminal connected to another end of the output-side coil; a first switch connected between the first output terminal and a ground; a second switch connected between the second output terminal and the ground; a first phase shift circuit having an input end connected to an output terminal of the first amplification element and an output end connected to one end of the input-side coil; and a second phase shift circuit having an input end connected to an output terminal of the second amplification element and an output end connected to another end of the input-side coil, the method including: supplying a first bias voltage from the bias circuit to the first amplification element, and supplying a second bias voltage having a smaller voltage value than the first bias voltage from the bias circuit to the second amplification element, based on the first switch being in a non-conductive state and the second switch being in a conductive state; and supplying the first bias voltage from the bias circuit to the first amplification element, and supplying the second bias voltage having a larger voltage value than the first bias voltage from the bias circuit to the second amplification element, based on the first switch being in the conductive state and the second switch being in the non-conductive state.

Effects

According to the present disclosure, it is possible to provide a radio frequency circuit including a Doherty-type power amplifier with suppressed deterioration of amplification performance, a communication device, and a power amplification method for a radio frequency circuit.

BRIEF DESCRIPTION OF DRAWINGS

FIG. 1B is a circuit configuration diagram of a radio frequency circuit according to Modification Example 1 of the embodiment.

FIG. 2B is a circuit state diagram of the radio frequency circuit according to the embodiment based on the signal of band A being transmitted in a middle/low power mode.

FIG. 3A is a circuit state diagram of the radio frequency circuit according to the embodiment based on a signal of band B being transmitted in the high power mode.

DESCRIPTION OF EMBODIMENTS

Figure 1A:
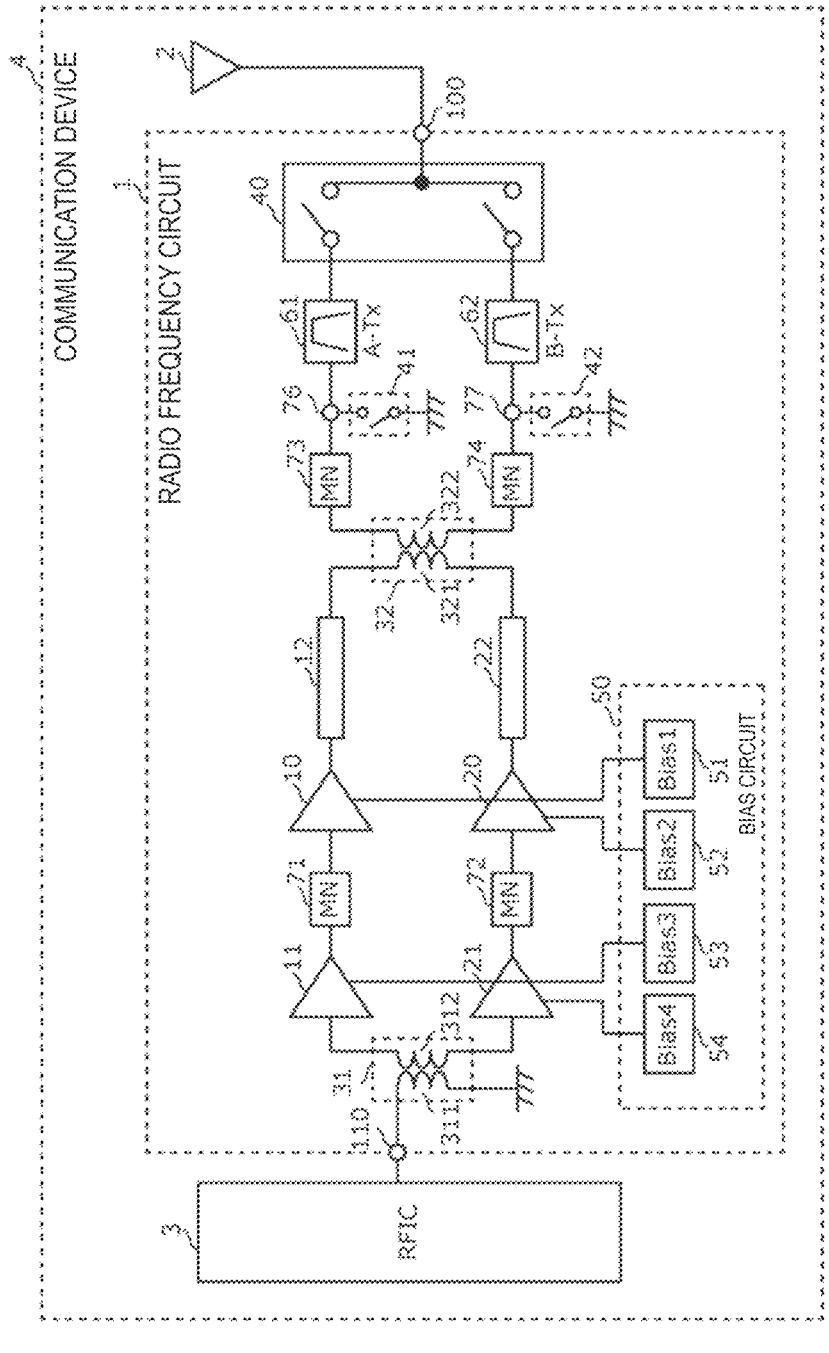
FIG. 1A is a circuit configuration diagram of a radio frequency circuit and a communication device according to an embodiment.

Embodiments of the present disclosure will be described in detail below. Note that all of the embodiments described below describe comprehensive or specific examples. Numerical values, shapes, materials, constituent elements, the arrangement and connection configuration of the components, and so forth that are described in the following embodiments are merely examples and are not intended to limit the present disclosure. Of constituent elements in the following example and modification example, a constituent element not described in an independent claim is described as an optional constituent element. Furthermore, the sizes or size ratios of constituent elements illustrated in drawings are not necessarily exact. In the figures, components that are substantially the same are denoted by the same reference numerals, and a repeated description thereof is omitted or simplified in some cases.

Furthermore, in the following description, terms, such as "parallel" and "perpendicular", representing a relationship between elements, a term, such as "rectangular", representing the shape of an element, and a numerical range refers to not only their exact meaning but also a substantially equivalent range, for example, the inclusion of a difference of about a few percent.

In each of the drawings, the x-axis and the y-axis are axes orthogonal to each other on a plane parallel to the main surface of a module substrate. Specifically, based on the module substrate having a rectangular shape in a plan view, the x-axis is parallel to a first side of the module substrate, and the y-axis is parallel to a second side orthogonal to the first side of the module substrate. In addition, the z-axis is an axis perpendicular to the main surface of the module substrate, and the positive direction thereof indicates an upward direction and the negative direction thereof indicates a downward direction.

In the circuit configuration of the present disclosure, the expression "connected" includes not only a case of being directly connected by a connection terminal and/or a wiring conductor, but also a case of being electrically connected with another circuit element interposed therebetween. The expression "connected between A and B" means "connected to both A and B between A and B", and in addition to "connected in series to a path that connects A and B to each other, the expression includes a parallel connection (shunt connection) between the path and a ground.

In the component disposition of the present disclosure, the expression "plan view of the module substrate" means viewing an object by orthographic projection from the positive side of the z-axis onto the xy plane. The expression "A is disposed between B and C" means that at least one of a plurality of line segments connecting any point in B and any point in C passes through A. The expression "distance between A and B in a plan view of the module substrate" means the length of the line segment that connects a representative point in the region of A and a representative point in the region of B orthogonally projected onto the xy plane to each other. In this case, as the representative point, the center point of the region, the point closest to the other region, or the like can be used, but the present disclosure is not limited thereto. Furthermore, terms, such as "parallel" and "perpendicular", representing a relationship between elements, a term, such as "rectangular", representing the shape of an element, and a numerical range refer to not only their exact meaning but also a substantially equivalent range, for example, the inclusion of an error of about a few percent.

Further, in the component disposition of the present disclosure, the expression "the component is disposed on the substrate" includes that the component is disposed on the main surface of the substrate and that the component is disposed in the substrate. The expression "the component is disposed on the main surface of the substrate" includes that the component is disposed above the main surface without making contact with the main surface (for example, the component is stacked on another component disposed while making contact with the main surface), in addition to that the component is disposed while making contact with the main surface. In addition, the expression "the component is disposed on the main surface of the substrate" may include that the component is disposed in a recess portion formed in the main surface. The expression "the component is disposed in the substrate" includes that the entire component is disposed between both main surfaces of the substrate, but a part of the component is not covered with the substrate, and only a part of the component is disposed in the substrate, in addition to that the component is encapsulated in the module substrate.

Further, the expression "signal path" described herein means a transmission line that includes wiring through which a radio frequency signal propagates, an electrode directly connected to the wiring, a terminal directly connected to the wiring or the electrode, and so forth.

Embodiment

1. Circuit Configuration of Radio Frequency Circuit
1 and Communication Device 4

A circuit configuration of a radio frequency circuit 1 and a communication device 4 according to the present embodiment will be described with reference to FIG. 1A. FIG. 1A is a circuit configuration diagram of the radio frequency circuit 1 and the communication device 4 according to an embodiment.

[1.1 Circuit Configuration of Communication Device 4]

First, the circuit configuration of the communication device 4 will be described. As illustrated in FIG. 1A, the communication device 4 according to the present embodiment includes the radio frequency circuit 1, an antenna 2, and an RF signal processing circuit (RFIC) 3.

The radio frequency circuit 1 transmits a radio frequency signal between the antenna 2 and the RFIC 3. The detailed circuit configuration of the radio frequency circuit 1 will be described below.

The antenna 2 is connected to the antenna connection terminal 100 of the radio frequency circuit 1, transmits the radio frequency signal output from the radio frequency circuit 1, and receives the radio frequency signal from an outside to output the radio frequency signal to the radio frequency circuit 1.

The RFIC 3 is an example of a signal processing circuit that processes a radio frequency signal. Specifically, the RFIC 3 performs signal processing on a received signal input through a reception path of the radio frequency circuit 1 by down-converting or the like, and outputs the received signal generated through the signal processing to a baseband signal processing circuit (BBIC, not illustrated). In addition, the RFIC 3 performs signal processing on a transmission signal input from the BBIC by up-converting or the like, and outputs the transmission signal generated through the signal processing to a transmission path of the radio frequency circuit 1. In addition, the RFIC 3 has a control unit that controls a switch, an amplification element, a bias circuit, and the like of the radio frequency circuit 1. A part or all of the functions of the RFIC 3 as the control unit may be mounted outside the RFIC 3, for example, may be mounted in the BBIC or the radio frequency circuit 1.

Further, the RFIC 3 also has a function as a control unit that controls a power supply voltage and a bias voltage supplied to each amplifier of the radio frequency circuit 1. Specifically, the RFIC 3 outputs a digital control signal to the radio frequency circuit 1. Each amplifier of the radio frequency circuit 1 is supplied with the power supply voltage and the bias voltage controlled by the digital control signal.

Further, the RFIC 3 also has a function as a control unit that controls connection of each switch of the radio frequency circuit 1 based on a band (frequency band) used.

In the communication device 4 according to the present embodiment, the antenna 2 is an optional element.

[1.2 Circuit Configuration of Radio frequency Circuit 1]

Next, a circuit configuration of the radio frequency circuit 1 will be described. As illustrated in FIG. 1A, the radio frequency circuit 1 includes power amplifiers 10 and 20, preamplifiers 11 and 21, phase shift lines 12 and 22, transformers 31 and 32, matching circuits 71, 72, 73, and 74, switches 40, 41, and 42, filters 61 and 62, a bias circuit 50, output terminals 76 and 77, an input terminal 110, and an antenna connection terminal 100.

The input terminal 110 is connected to the RFIC 3, and the antenna connection terminal 100 is connected to the antenna 2. The output terminal 76 is an example of a first output terminal, and the output terminal 77 is an example of a second output terminal.

Each of the input terminal 110, the antenna connection terminal 100, the output terminal 76, and the output terminal 77 may be metal conductors such as a metal electrode and a metal bump, or may be one point on a metal wiring.

The transformer 31 has an input-side coil 311 and an output-side coil 312. One end of the input-side coil 311 is connected to the input terminal 110, and the other end of the input-side coil 311 is connected to a ground. One end of the output-side coil 312 is connected to an input terminal of the preamplifier 11, and the other end of the output-side coil 312 is connected to an input terminal of the preamplifier 21. The transformer 31 distributes a radio frequency signal output from the input terminal 110 into two radio frequency signals having opposite phases. The two distributed radio frequency signals are input to preamplifiers 11 and 21, respectively.

The preamplifier 11 amplifies the radio frequency signal of band A and band B input from one end of the output-side coil 312. The preamplifier 21 amplifies the radio frequency signal of band A and band B input from the other end of the output-side coil 312.

The power amplifier 10 is an example of a first amplification element and has an amplification transistor. The power amplifier 20 is an example of a second amplification element and has an amplification transistor. The amplification transistor is, for example, a bipolar transistor such as a heterojunction bipolar transistor (HBT) or an electric field effect transistor such as a metal-oxide-semiconductor field effect transistor (MOSFET).

The power amplifiers 10 and 20 function as a class A (or class AB) amplification element that enables an amplification operation on all power levels of an input signal, and function as a class C amplification element that enables an amplification operation with low distortion in a high-output region. The power amplifiers 10 and 20 can switch between a class A (or class AB) operation and a class C operation depending on a magnitude of the bias voltage supplied from the bias circuit 50.

A phase shift circuit may be disposed instead of the transformer 31. In addition, the transformer 31 and the preamplifiers 11 and 21 may be omitted.

An input terminal of the power amplifier 10 is connected to an output terminal of the preamplifier 11 with the matching circuit 71 interposed therebetween. An input terminal of the power amplifier 20 is connected to an output terminal of the preamplifier 21 with the matching circuit 72 interposed therebetween.

The phase shift line 12 is an example of a first phase shift circuit, and is, for example, a ¼ wavelength transmission line. The phase shift line 12 delays a phase of the radio frequency signal input from one end thereof by ¼ wavelength and outputs the delayed signal from the other end. One end of the phase shift line 12 is connected to the output terminal of the power amplifier 10, and the other end of the phase shift line 12 is connected to one end of the input-side coil 321.

The phase shift line 22 is an example of a second phase shift circuit, and is, for example, a ¼ wavelength transmission line. The phase shift line 22 delays a phase of the radio frequency signal input from one end thereof by ¼ wavelength and outputs the delayed signal from the other end. One end of the phase shift line 22 is connected to an output terminal of the power amplifier 20, and the other end of the phase shift line 22 is connected to the other end of the input-side coil 321.

The first phase shift circuit and the second phase shift circuit do not need to have a form of a phase shift line, and may be, for example, a circuit including a chip-shaped inductor and a capacitor. More specifically, each of the first phase shift circuit and the second phase shift circuit may be an LC circuit including two inductors connected in series to each other, and a capacitor connected between a connection point of the two inductors and a ground. In addition, each of the first phase shift circuit and the second phase shift circuit may be an LC circuit including two capacitors connected in series to each other, an inductor connected between a ground and one end of one of the two capacitors, and an inductor connected between a ground and the other end of the one capacitor.

Figure 1B:
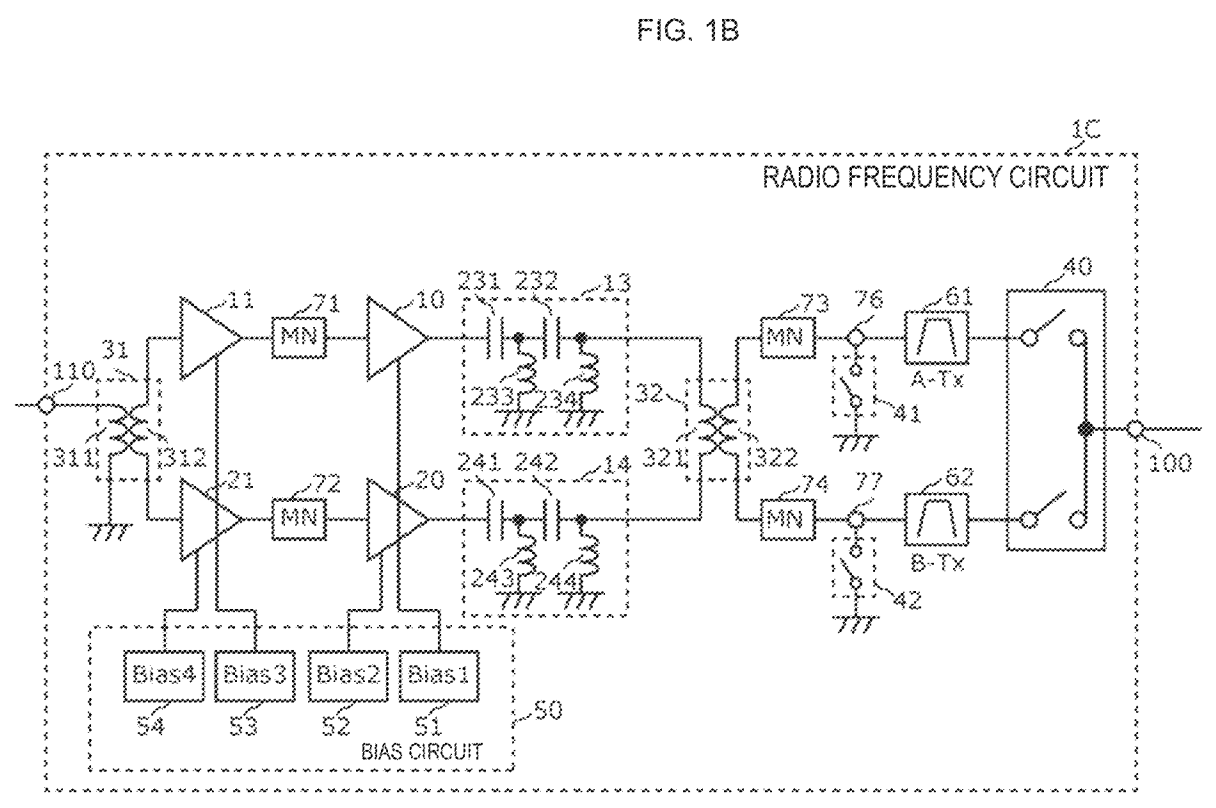

FIG. 1B is a circuit configuration diagram of a radio frequency circuit 1C according to Modification Example 1 of the embodiment. In the radio frequency circuit 1C according to the present modification example, each of the first phase shift circuit and the second phase shift circuit is the LC circuit. As illustrated in FIG. 1B, the radio frequency circuit 1C includes power amplifiers 10 and 20, preamplifiers 11 and 21, phase shift circuits 13 and 14, transformers 31 and 32, matching circuits 71, 72, 73, and 74, switches 40, 41, and 42, filters 61 and 62, a bias circuit 50, output terminals 76 and 77, an input terminal 110, and an antenna connection terminal 100. The radio frequency circuit 1C according to the present modification example is different in a configuration of the phase shift circuit, as compared with the radio frequency circuit 1 according to the embodiment. Hereinafter, regarding the radio frequency circuit 1C according to the present modification example, the same points as the radio frequency circuit 1 according to the embodiment are omitted, and different points are mainly described.

The phase shift circuit 13 is an example of a first phase shift circuit, and has capacitors 231 and 232 and inductors 233 and 234. The capacitor 231 is an example of a fifth capacitor, and has one end (one electrode) connected to the output terminal of the power amplifier 10. The capacitor 232 is an example of a sixth capacitor, and has one end (one electrode) connected to the other end (the other electrode) of the capacitor 231 and the other end (the other electrode) connected to one end of the input-side coil 321. That is, the capacitors 231 and 232 are connected in series between the output terminal of the power amplifier 10 and one end of the input-side coil 321. The inductor 233 is an example of a fifth inductor, and is connected between a ground and a connection point of the capacitor 231 and the capacitor 232. The inductor 234 is an example of a sixth inductor, and is connected between a ground and a connection point of the capacitor 232 and one end of the input-side coil 321.

The phase shift circuit 14 is an example of a second phase shift circuit, and has capacitors 241 and 242 and inductors 243 and 244. The capacitor 241 is an example of a seventh capacitor, and has one end (one electrode) connected to the output terminal of the power amplifier 20. The capacitor 242 is an example of an eighth capacitor, and has one end (one electrode) connected to the other end (the other electrode) of the capacitor 241 and the other end (the other electrode) connected to the other end of the input-side coil 321. That is, the capacitors 241 and 242 are connected in series between the output terminal of the power amplifier 20 and the other end of the input-side coil 321. The inductor 243 is an example of a seventh inductor, and is connected between a ground and a connection point of the capacitor 241 and the capacitor 242. The inductor 244 is an example of an eighth inductor, and is connected between a ground and a connection point of the capacitor 242 and the other end of the input-side coil 321.

With the above configuration, for example, the phase shift circuit 13 delays a phase of the radio frequency signal input from one end of the capacitor 231 by ¼ wavelength and outputs the phase from the other end of the capacitor 232. In addition, for example, the phase shift circuit 14 delays a phase of the radio frequency signal input from one end of the capacitor 241 by ¼ wavelength and outputs the phase from the other end of the capacitor 242.

In the radio frequency circuit 1C according to the present modification example, both the phase shift circuits 13 and 14 have two capacitors and two inductors, but at least one of the phase shift circuits 13 and 14 may have two capacitors and two inductors.

The phase shift circuit is defined as a circuit that advances or delays the phase shift of the radio frequency signal that propagates through the transmission line. Specifically, the phase shift circuit is a phase shift line (1) having a larger or smaller line width than a line connected to the phase shift circuit, and (2) having a longer line length due to a spiral type or a meander type.

Specifically, the phase shift circuit may include circuit elements of the inductor and the capacitor.

The transformer 32 is an example of an output transformer, and has an input-side coil 321 and an output-side coil 322. One end of the input-side coil 321 is connected to the other end of the phase shift line 12, and the other end of the input-side coil 321 is connected to the other end of the phase shift line 22. Although not illustrated, a midpoint of the input-side coil 321 is connected to a power supply (power supply voltage Vcc). One end of the output-side coil 322 is connected to the output terminal 76 with the matching circuit 73 interposed therebetween, and the other end of the output-side coil 322 is connected to the output terminal 77 with the matching circuit 74 interposed therebetween.

The switch 41 is an example of a first switch and is connected between the output terminal 76 and a ground. The switch 42 is an example of a second switch and is connected between the output terminal 77 and a ground.

The filter 61 is an example of a first filter, and has a pass band that includes band A (first band). An input end of the filter 61 is connected to the output terminal 76. The filter 62 is an example of a second filter, and has a pass band that includes band B (second band). An input end of the filter 62 is connected to the output terminal 77.

The switch 40 is an example of an antenna switch, is connected to the antenna connection terminal 100, switches connection and non-connection of the antenna connection terminal 100 and the filter 61, and switches connection and non-connection of the antenna connection terminal 100 and the filter 62.

The matching circuit 71 matches output impedance of the preamplifier 11 and input impedance of the power amplifier 10. The matching circuit 72 matches output impedance of the preamplifier 21 and input impedance of the power amplifier 20.

The matching circuit 73 performs impedance matching between the transformer 32 and the filter 61. The matching circuit 74 performs impedance matching between the transformer 32 and the filter 62.

The filters 61 and 62, the switch 40, and the matching circuits 71 to 74 are optional elements of the radio frequency circuit according to the present disclosure.

The bias circuit 50 is connected to the power amplifiers 10 and 20 and the preamplifiers 11 and 21, and supplies a bias voltage (and/or a bias current) to each of the amplifiers. The bias circuit 50 has, for example, bias supply circuits 51, 52, 53, and 54. The bias supply circuit 51 is an example of a first bias circuit, and supplies a first bias voltage (and/or a first bias current) to the power amplifier 10. The bias supply circuit 52 is an example of a second bias circuit, and supplies a second bias voltage (and/or a second bias current) to the power amplifier 20. In addition, the bias supply circuit 53 supplies a third bias voltage (and/or a third bias current) to the preamplifier 11. In addition, the bias supply circuit 54 supplies a fourth bias voltage (and/or a fourth bias current) to the preamplifier 21. The bias circuit 50 changes the first bias voltage (and/or the first bias current) supplied to the power amplifier 10 in synchronization with a timing of switching between conduction and non-conduction of the switches 41 and 42, and changes the second bias voltage (and/or the second bias current) supplied to the power amplifier 20. A voltage value (current value) of the first bias voltage (and/or the first bias current) is different from a voltage value (current value) of the second bias voltage (and/or the second bias current).

In the present embodiment, the bias voltage is supplied from the bias circuit 50 to the power amplifiers 10 and 20, but in practice, the bias current is supplied from the bias circuit 50, and the bias current is supplied as a bias voltage by a resistance element disposed in a path that connects the bias circuit 50 and the power amplifiers 10 and 20 to each other. Therefore, in the radio frequency circuit according to the present disclosure, it can be said that "the bias voltage supplied from the bias circuit 50 to the power amplifiers 10 and 20" is "the bias current supplied from the bias circuit 50 to the power amplifiers 10 and 20". Accordingly, it can be said that "a voltage value of the first bias voltage is different from a voltage value of the second bias voltage" is "a current value of the first bias current is different from a current value of the second bias current.

In this case, based on the power amplifier 10 being be operated as a carrier amplifier (operated in class A or class AB), the bias supply circuit 51 supplies the first bias voltage (and/or the first bias current) having a larger voltage value (current value) than the second bias voltage (and/or the second bias current) to the power amplifier 10. In addition, based on the power amplifier 20 being operated as a peak amplifier (operated in class C), the bias supply circuit 52 supplies the second bias voltage (and/or the second bias current) having a smaller voltage value (current value) than the first bias voltage (and/or the first bias current) to the power amplifier 20.

Further, based on the power amplifier 10 being operated as the peak amplifier (operated in class C), the bias supply circuit 51 supplies the first bias voltage having a smaller voltage value than the second bias voltage to the power amplifier 10. In addition, based on the power amplifier 20 being operated as the carrier amplifier (operated in class A or class AB), the bias supply circuit 52 supplies the second bias voltage having a larger voltage value than the first bias voltage to the power amplifier 20.

The bias circuit 50 does not need to have the four bias supply circuits 51 to 54, and for example, may supply a plurality of bias voltages having different voltage values from one bias supply circuit to each amplifier.

In the present embodiment, since each of band A and band B and each of band A to band D to be described below are a communication system constructed using a radio access technology (RAT), they refer to a frequency band predefined by a standardization organization (for example, 3rd Generation Partnership Project (3GPP) (registered trademark), Institute of Electrical and Electronics Engineers (IEEE), and the like), but the present disclosure is not limited to the bands described above. In the present embodiment, as the communication system, for example, a 4G-LTE system, a 5G-NR system, a Wireless Local Area Network (WLAN) system, and the like can be used, but the present disclosure is not limited thereto.

According to the above circuit configuration, the radio frequency circuit 1 can transmit the radio frequency signals of band A and band B from the input terminal 110 toward the antenna connection terminal 100. In this case, for example, the signal of band A can be output while passing through the output terminal 76, and the signal of band B can be output while passing through the output terminal 77. The power amplifiers 10 and 20 can be exclusively operated as the carrier amplifier and the peak amplifier depending on the magnitude of the bias voltage supplied from the bias circuit 50. Therefore, the radio frequency circuit 1 can function as a Doherty-type power amplification circuit having high efficiency and a high back-off amount for the signals of band A and band B.

The Doherty-type power amplification circuit refers to an amplifier circuit that achieves high efficiency by using a plurality of power amplifiers as the carrier amplifier and the peak amplifier. The carrier amplifier refers to an amplifier that is operated even based on power of the radio frequency signal (input) being low or high in the Doherty-type power amplification circuit. The peak amplifier refers to an amplifier that is mainly operated based on the power of a radio frequency signal (input) being high in the Doherty-type power amplification circuit. Therefore, based on the input power of the radio frequency signal being low, the radio frequency signal is mainly amplified by the carrier amplifier, and based on the input power of the radio frequency signal being high, the radio frequency signal is amplified by the carrier amplifier and the peak amplifier and synthesized. Due to such an operation, in the Doherty-type power amplification circuit, load impedance viewed from the carrier amplifier at low output power increases, and the efficiency at low output power is improved.

It is possible that the power amplifiers 10 and 20 are different in size from each other. Accordingly, the power amplifiers 10 and 20 can have different saturation power (intercept points). Therefore, the back-off amount, which is a power difference from a high-output region in which the carrier amplifier and the peak amplifier are turned on, to a low-output region in which only the carrier amplifier is turned on, can be changed according to switching of the carrier amplifier and the peak amplifier of the power amplifiers 10 and 20.

A size of an amplifier depends on the number of stages, the number of cells, or the number of fingers of a transistor constituting the amplifier. Therefore, based on the size being different, the number of stages, the number of cells, or the number of fingers of the transistor is different.

[1.3 Flow of Radio Frequency Signal in Radio Frequency Circuit 1]

Next, a flow of the radio frequency signals of band A and band B in the radio frequency circuit 1 will be described.

Figure 2A:
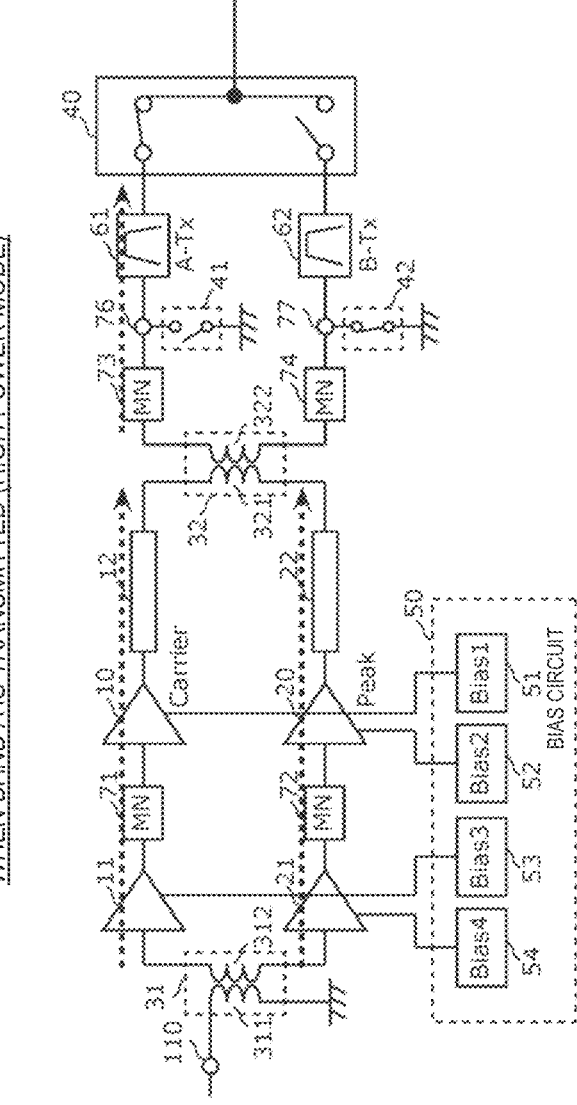
FIG. 2A is a circuit state diagram of the radio frequency circuit according to the embodiment based on a signal of band A being transmitted in a high power mode.
Figure 2B:
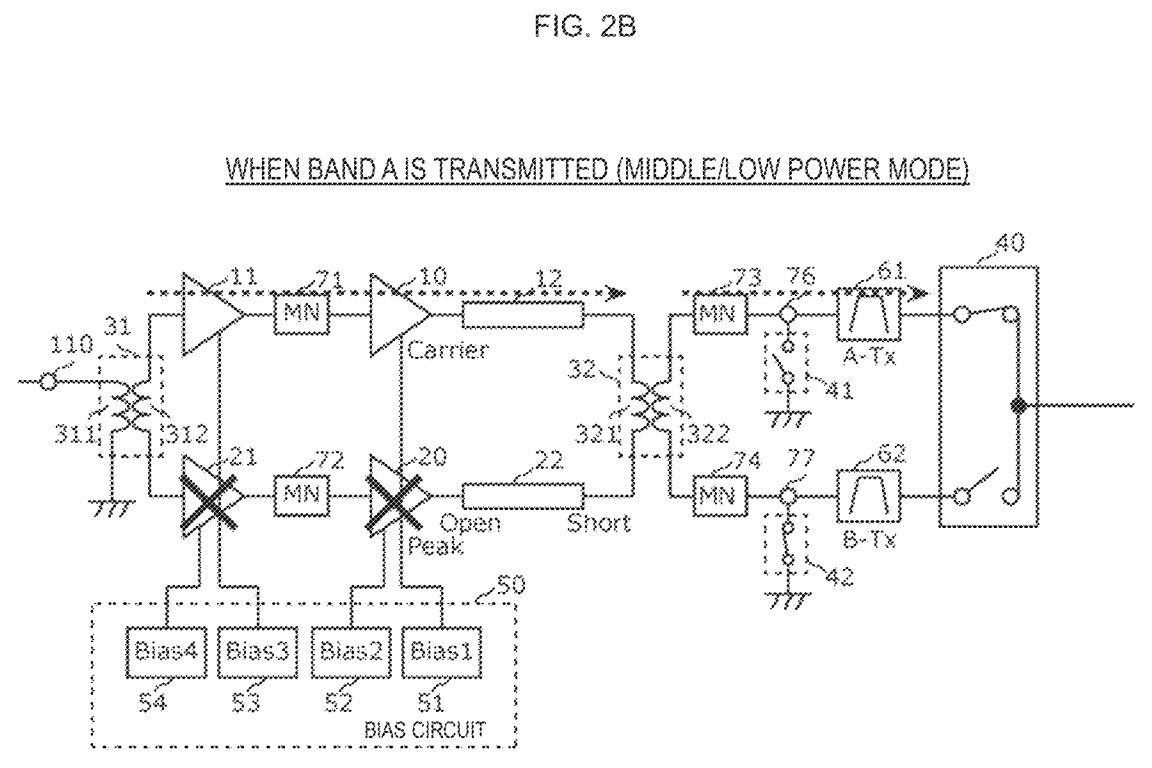

FIG. 2A is a circuit state diagram of the radio frequency circuit 1 according to the embodiment based on the signal of band A being transmitted in a high power mode. In addition, FIG. 2B is a circuit state diagram of the radio frequency circuit 1 according to the embodiment based on the signal of band A being transmitted in a middle/low power mode.

First, as illustrated in FIG. 2A, based on the radio frequency circuit 1 transmits a signal of band A in a high power mode, the power amplifier 10 is operated as the carrier amplifier (operated in class A or class AB), and the power amplifier 20 is operated as the peak amplifier (operated in class C). In this case, the bias supply circuit 51 supplies the first bias voltage having a larger voltage value than the second bias voltage to the power amplifier 10. In addition, the bias supply circuit 52 supplies the second bias voltage having a smaller voltage value than the first bias voltage to the power amplifier 20. In addition, the switch 41 is in a non-conductive state, and the switch 42 is in a conductive state.

Based on the signal of band A being transmitted in the high power mode, both the power amplifiers 10 and 20 are operated (ON). In this case, the signal of band A transmitted through the input terminal 110, the preamplifier 11, the power amplifier 10, and the phase shift line 12 and the signal of band A transmitted through the input terminal 110, the preamplifier 21, the power amplifier 20, and the phase shift line 22 are voltage-synthesized by the transformer 32, and the signal of band A subjected to the voltage synthesis is output from the antenna connection terminal 100 while passing through the output terminal 76, the filter 61, and the switch 40.

In the conventional radio frequency circuit, one of two power amplifiers is always operated as the carrier amplifier, and the other is operated as the peak amplifier, and thus the ¼ wavelength transmission line is connected only to one output terminal of the two amplifiers. Therefore, a phase difference at 90 degrees is added to the signals input to the two preamplifiers, and a phase difference at 180 degrees is added to the two signals of band A input to the output transformer. On the other hand, in the radio frequency circuit 1 according to the present embodiment, the two power amplifiers 10 and 20 have the phase shift circuit that is connected to both output terminals of the two amplifiers in order to exclusively switch the carrier amplifier and the peak amplifier. Therefore, a phase difference at 180 degrees is added to the signals input to the two preamplifiers by the transformer 31, and a phase difference at 180 degrees is added to the two signals of band A input to the transformer 32.

In the radio frequency circuit 1 according to the present embodiment, as described above, since the phase difference at 180 degrees is added to the signals input to the two preamplifiers by the transformer 31, the radio frequency circuit 1 can also be applied as a differential amplifier-type power amplifier.

Next, as illustrated in FIG. 2B, based on the radio frequency circuit 1 transmitting a signal of band A in a middle/low power mode, the power amplifier 10 is operated as the carrier amplifier (operated in class A or class AB), and the power amplifier 20 is operated as the peak amplifier (operated in class C). In this case, the bias supply circuit 51 supplies the first bias voltage having a larger voltage value than the second bias voltage to the power amplifier 10. In addition, the bias supply circuit 52 supplies the second bias voltage having a smaller voltage value than the first bias voltage to the power amplifier 20. In addition, the switch 41 is in a non-conductive state, and the switch 42 is in a conductive state.

Based on the signal of band A being transmitted in the middle/low power mode, the power amplifier 10 is operated (ON), and the power amplifier 20 is not operated (OFF). In this case, the output impedance of the power amplifier 20 is in an open state, and the impedance of the other end of the input-side coil 321 by the phase shift line 22 is in a short-circuit state. Accordingly, the signal of band A transmitted through the input terminal 110, the preamplifier 11, the power amplifier 10, and the phase shift line 12 is voltage-converted by the transformer 32, and the signal of band A subjected to the voltage conversion is output from the antenna connection terminal 100 while passing through the output terminal 76, the filter 61, and the switch 40.

Based on the signal of band A being transmitted, the output impedance of the power amplifier 10 in the middle/ low power mode is twice as large as that in the high power mode. That is, in the middle/low power mode, the power amplifier 20 is turned off and the output impedance of the power amplifier 10 increases, so that the radio frequency circuit 1 can be operated with high efficiency.

On the other hand, in the high power mode, the high power signal can be output by operating both the power amplifiers 10 and 20, it is possible to suppress signal distortion because the output impedance of the power amplifiers 10 and 20 is low.

Figure 3A:
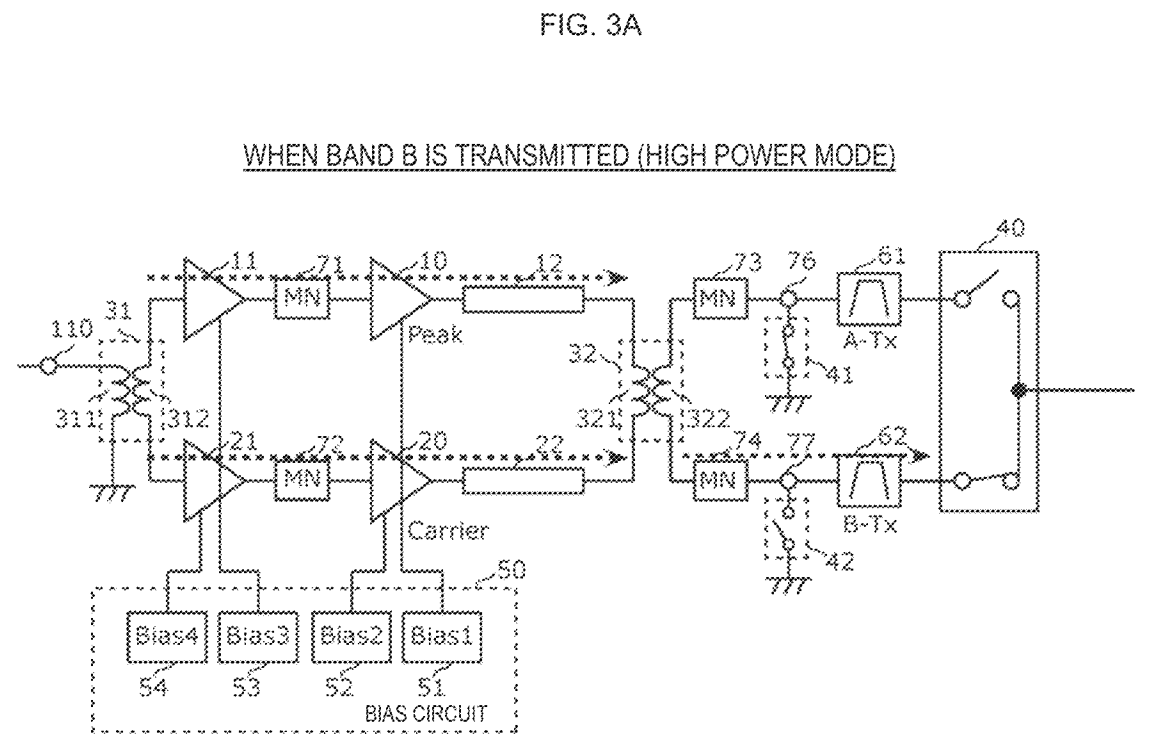
Figure 3B:
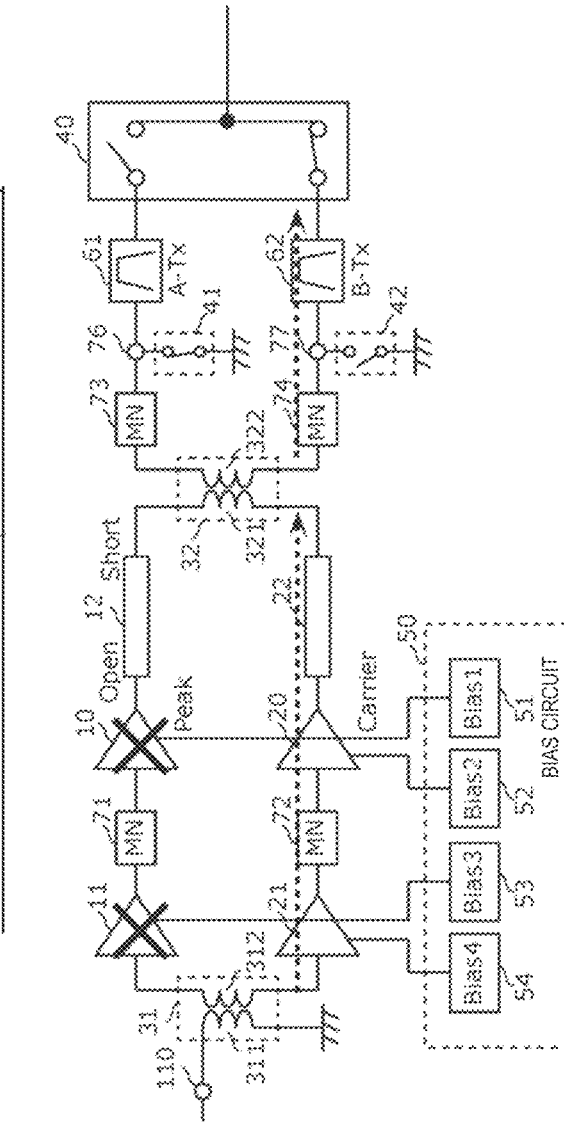
FIG. 3B is a circuit state diagram of the radio frequency circuit according to the embodiment based on the signal of band B being transmitted in the middle/low power mode.

FIG. 3A is a circuit state diagram of the radio frequency circuit 1 according to the embodiment based on a signal of band B being transmitted in the high power mode. In addition, FIG. 3B is a circuit state diagram of the radio frequency circuit 1 according to the embodiment based on the signal of band B being transmitted in the middle/low power mode.

First, as illustrated in FIG. 3A, based on the radio frequency circuit 1 transmitting a signal of band B in the high power mode, the power amplifier 20 is operated as the carrier amplifier (operated in class A or class AB), and the power amplifier 10 is operated as the peak amplifier (operated in class C). In this case, the bias supply circuit 51 supplies the first bias voltage having a smaller voltage value than the second bias voltage to the power amplifier 10. In addition, the bias supply circuit 52 supplies the second bias voltage having a larger voltage value than the first bias voltage to the power amplifier 20. In addition, the switch 41 is in a conductive state, and the switch 42 is in a non-conductive state.

Based on the signal of band B being transmitted in the high power mode, both the power amplifiers 10 and 20 are operated (ON). In this case, the signal of band B transmitted through the input terminal 110, the preamplifier 11, the power amplifier 10, and the phase shift line 12 and the signal of band B transmitted through the input terminal 110, the preamplifier 21, the power amplifier 20, and the phase shift line 22 are voltage-synthesized by the transformer 32, and the signal of band B subjected to the voltage synthesis is output from the antenna connection terminal 100 while passing through the output terminal 77, the filter 62, and the switch 40.

Next, as illustrated in FIG. 3B, based on the radio frequency circuit 1 transmitting a signal of band B in a middle/low power mode, the power amplifier 20 is operated as the carrier amplifier (operated in class A or class AB), and the power amplifier 10 is operated as the peak amplifier (operated in class C). In this case, the bias supply circuit 51 supplies the first bias voltage having a smaller voltage value than the second bias voltage to the power amplifier 10. In addition, the bias supply circuit 52 supplies the second bias voltage having a larger voltage value than the first bias voltage to the power amplifier 20. In addition, the switch 41 is in a conductive state, and the switch 42 is in a non-conductive state.

Based on the signal of band B being transmitted in the middle/low power mode, the power amplifier 20 is operated (ON), and the power amplifier 10 is not operated (OFF). In this case, the output impedance of the power amplifier 10 is in an open state, and the impedance of one end of the input-side coil 321 by the phase shift line 12 is in a short-circuit state. Accordingly, the signal of band B transmitted through the input terminal 110, the preamplifier 21, the power amplifier 20, and the phase shift line 22 is voltage-converted by the transformer 32, and the signal of band B subjected to the voltage conversion is output from the antenna connection terminal 100 while passing through the output terminal 77, the filter 62, and the switch 40.

Based on the signal of band B being transmitted, the output impedance of the power amplifier 20 in the middle/ low power mode is twice as large as that in the high power mode. That is, in the middle/low power mode, the power amplifier 10 is turned off and the output impedance of the power amplifier 20 increases, so that the radio frequency circuit 1 can be operated with high efficiency.

On the other hand, in the high power mode, the high power signal can be output by operating both the power amplifiers 10 and 20, it is possible to suppress signal distortion because the output impedance of the power amplifiers 10 and 20 is low.

Figure 4:
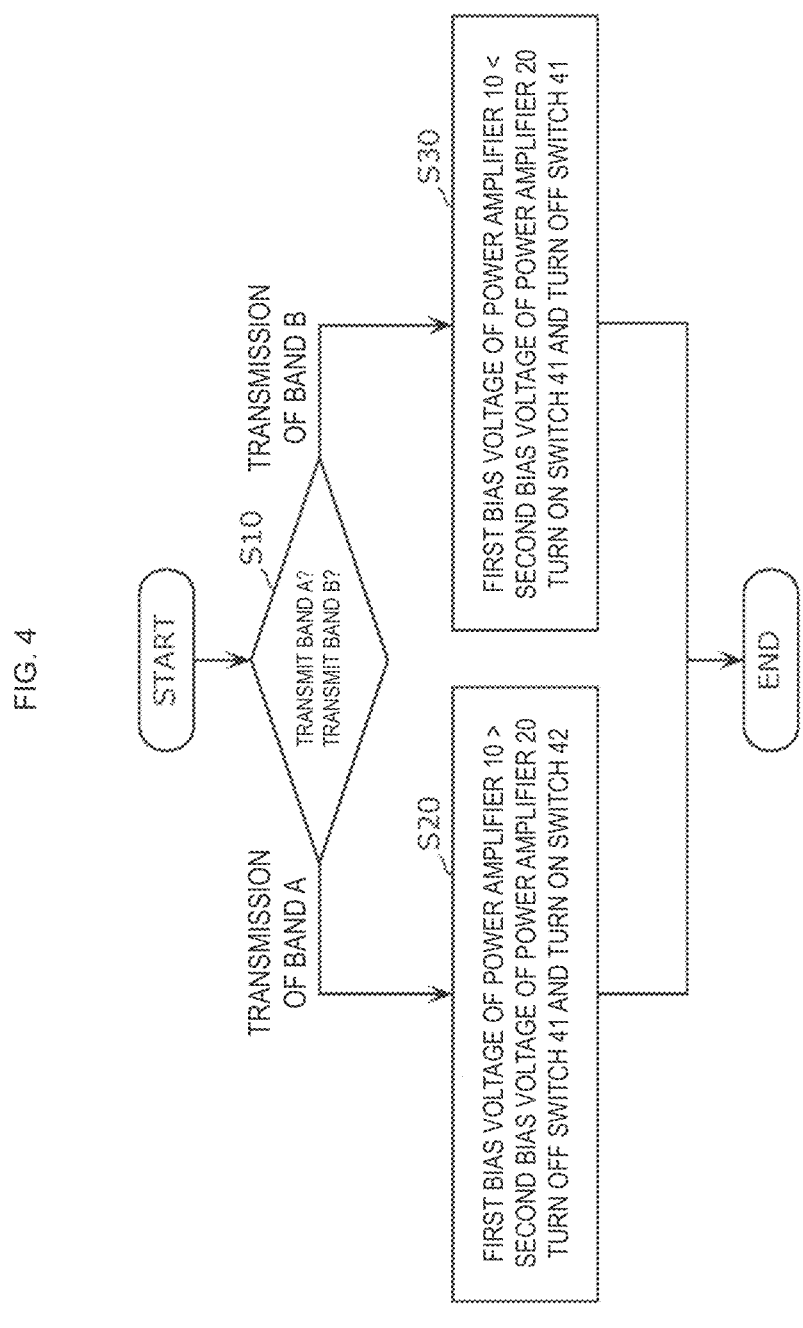
FIG. 4 is an operation flowchart illustrating a power amplification method for a radio frequency circuit according to the embodiment.

FIG. 4 is an operation flowchart illustrating a power amplification method for a radio frequency circuit 1 according to the embodiment.

First, the control unit of the radio frequency circuit 1 selects which of signals of band A and band B are transmitted based on an instruction from, for example, the RFIC 3 (S10).

Based on the transmission of the signal of band A being selected in step S10, the control unit of the radio frequency circuit 1 supplies the first bias voltage having a larger voltage value than the second bias voltage from the bias circuit 50 to the power amplifier 10. As a result, the power amplifier 10 is operated as the carrier amplifier. In addition, the control unit of the radio frequency circuit 1 supplies the second bias voltage having a smaller voltage value than the first bias voltage, from the bias circuit 50 to the power amplifier 20. As a result, the power amplifier 20 is operated as the peak amplifier. Further, the control unit of the radio frequency circuit 1 controls the switch 41 to be in a non-conductive state, and controls the switch 42 to be in a conductive state (S20). Accordingly, based on the signal of band A being transmitted, the radio frequency circuit 1 is operated as the Doherty-type power amplifier in which the power amplifier 10 is the carrier amplifier and the power amplifier 20 is the peak amplifier to transmit the signal of band A while passing through the output terminal 76.

Furthermore, based on the transmission of the signal of band B being selected in step S10, the control unit of the radio frequency circuit 1 supplies the first bias voltage having a smaller voltage value than the second bias voltage, from the bias circuit 50 to the power amplifier 10. As a result, the power amplifier 10 is operated as the peak amplifier. In addition, the control unit of the radio frequency circuit 1 supplies the second bias voltage having a larger voltage value than the first bias voltage from the bias circuit 50 to the power amplifier 20. As a result, the power amplifier 20 is operated as the carrier amplifier. Further, the control unit of the radio frequency circuit 1 controls the switch 41 to be in a conductive state, and controls the switch 42 to be in a non-conductive state (S30). Accordingly, based on the signal of band B being transmitted, the radio frequency circuit 1 is operated as the Doherty-type power amplifier in which the power amplifier 20 is the carrier amplifier and the power amplifier 10 is the peak amplifier to transmit the signal of band B while passing through the output terminal 77.

Accordingly, the power amplifiers 10 and 20 can be exclusively switched to the carrier amplifier and the peak amplifier by changing the magnitude of the bias voltage supplied from the bias circuit 50 to each amplifier. In addition, by exclusively switching the conduction and the non-conduction of the switches 41 and 42 in conjunction with the above switching, the signal of band A can be transmitted via the output terminal 76, and the signal of band B can be transmitted while passing through the output terminal 77. Thus, since any one of the power amplifier 10 or 20 can be fixed to the carrier amplifier that is easily deteriorated so as to avoid operating, it is possible to provide the radio frequency circuit 1 having the Doherty-type power amplifier with suppressed deterioration of the power amplifiers 10 and 20.

Based on the signals of band A and band B being transmitted, switches are not disposed in series in the signal paths from the input terminal 110 to the filters 61 and 62, so that an increase in transmission loss due to the on-resistance of the switches can be suppressed.

The radio frequency circuit 1 according to the present embodiment is not limited to transmitting in two different bands. The radio frequency circuit 1 according to the present embodiment can be applied based on the signal of one band being transmitted.

Hereinafter, for example, an operation based on the signal of band A being transmitted will be described.

First, the control unit of the radio frequency circuit 1 supplies the first bias voltage having a larger voltage value than the second bias voltage, from the bias circuit 50 to the power amplifier 10 in a first period. As a result, the power amplifier 10 is operated as the carrier amplifier. In addition, the control unit of the radio frequency circuit 1 supplies the second bias voltage having a smaller voltage value than the first bias voltage, from the bias circuit 50 to the power amplifier 20. As a result, the power amplifier 20 is operated as the peak amplifier. Further, the control unit of the radio frequency circuit 1 controls the switch 41 to be in a non-conductive state, and controls the switch 42 to be in a conductive state. Accordingly, based on the signal of band A being transmitted in the first period, the radio frequency circuit 1 is operated as the Doherty-type power amplifier in which the power amplifier 10 is the carrier amplifier and the power amplifier 20 is the peak amplifier to transmit the signal of band A while passing through the output terminal 76.

Further, the control unit of the radio frequency circuit 1 supplies the first bias voltage having a smaller voltage value than the second bias voltage, from the bias circuit 50 to the power amplifier 10 in a second period different from the first period. As a result, the power amplifier 10 is operated as the peak amplifier. In addition, the control unit of the radio frequency circuit 1 supplies the second bias voltage having a larger voltage value than the first bias voltage from the bias circuit 50 to the power amplifier 20. As a result, the power amplifier 20 is operated as the carrier amplifier. Further, the control unit of the radio frequency circuit 1 controls the switch 41 to be in a conductive state, and controls the switch 42 to be in a non-conductive state. Accordingly, based on the signal of band A being transmitted in the second period, the radio frequency circuit 1 is operated as the Doherty-type power amplifier in which the power amplifier 10 is the carrier amplifier and the power amplifier 20 is the peak amplifier to transmit the signal of band A while passing through the output terminal 77.

Accordingly, the power amplifiers 10 and 20 can be exclusively switched to the carrier amplifier and the peak amplifier by changing the magnitude of the bias voltage supplied from the bias circuit 50 to each amplifier. In addition, by exclusively switching the conduction and the non-conduction of the switches 41 and 42 in conjunction with the above switching, the signal of band A can be transmitted via the output terminal 76 in the first period, and the signal of band A can be transmitted while passing through the output terminal 77 in the second period. Thus, since any one of the power amplifier 10 or 20 can be fixed to the carrier amplifier that is easily deteriorated so as to avoid operating, it is possible to provide the radio frequency circuit 1 having the Doherty-type power amplifier with suppressed deterioration of the power amplifiers 10 and 20.

In the above-described circuit operation of the radio frequency circuit 1, the control unit of the radio frequency circuit 1 controls the magnitude of the bias voltage of the bias circuit 50 and the conduction of the switches 41 and 42, but the RFIC 3 of the communication device 4 may control the magnitude of the bias voltage of the bias circuit 50 and the conduction of the switches 41 and 42 instead of the control unit of the radio frequency circuit 1.

In addition, the power amplification method of the radio frequency circuit 1 according to the present embodiment switches the carrier amplifier and the peak amplifier by changing the magnitude of the bias voltage supplied to each amplifier, but the present disclosure is not limited thereto. As a method for setting each amplifier to the carrier amplifier and the peak amplifier, the magnitude of the power supply voltage supplied to each amplifier may be varied or the size of each amplifier may be varied.

That is, in the power amplification method for the radio frequency circuit 1 according to the present embodiment, based on the switch 41 being in a non-conductive state and the switch 42 being in a conductive state, the power amplifier 10 may be operated in class AB or class A, and the power amplifier 20 may be operated in class C, and based on the switch 41 being in a conductive state and the switch 42 being in a non-conductive state, the power amplifier 10 may be operated in class C, and the power amplifier 20 may be operated in class AB or class A.

Therefore, since either of the power amplifier 10 or 20 can be fixed to the carrier amplifier that is easily deteriorated so as to avoid operating, it is possible to provide a radio frequency circuit having the Doherty-type power amplifier with suppressed deterioration of the power amplifiers 10 and 20.

[1.4 Circuit Configuration of Radio Frequency Circuit 1A According to Modification Example 2]

Figure 5:
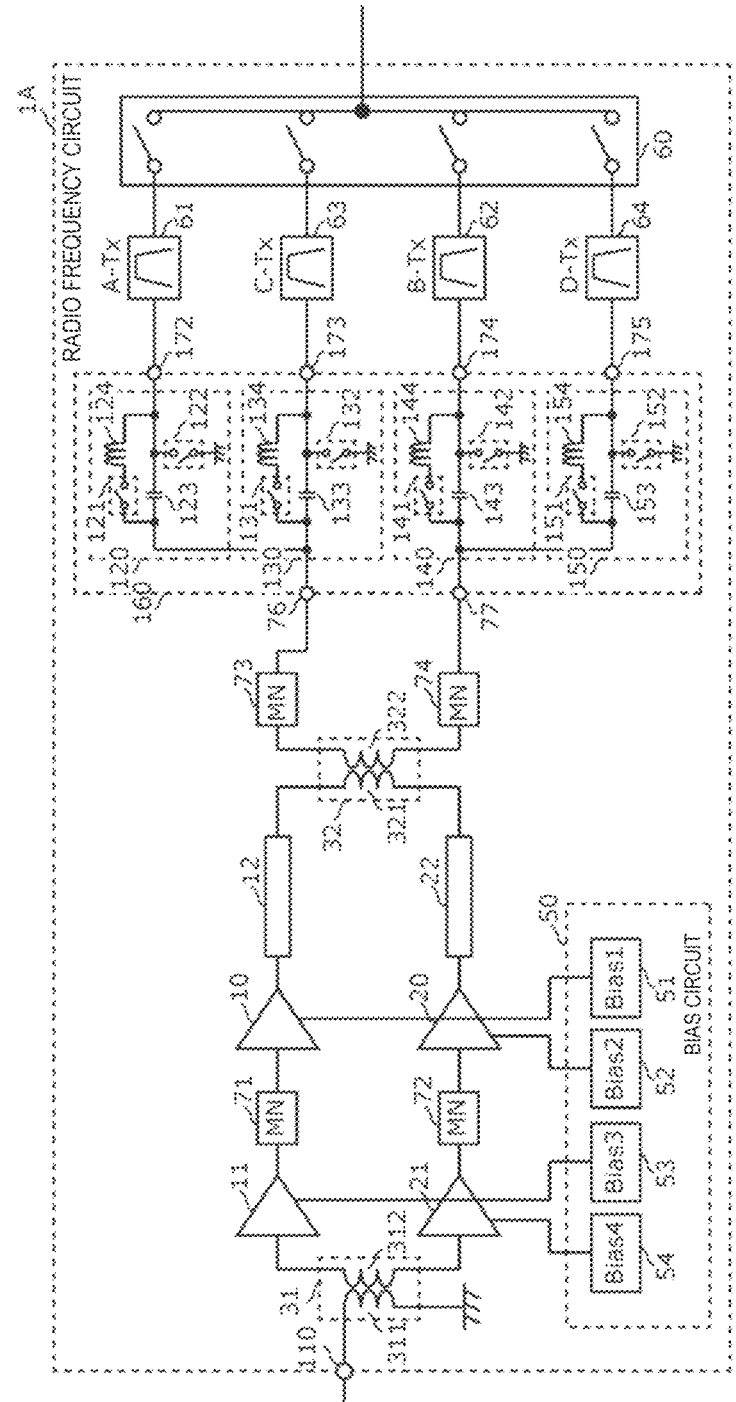
FIG. 5 is a circuit configuration diagram of a radio frequency circuit according to Modification Example 2 of the embodiment.

FIG. 5 is a circuit configuration diagram of a radio frequency circuit 1A according to Modification Example 2 of the embodiment. As illustrated in FIG. 5, the radio frequency circuit 1A includes power amplifiers 10 and 20, preamplifiers 11 and 21, phase shift lines 12 and 22, transformers 31 and 32, matching circuits 71, 72, 73, 74, 120, 130, 140, and 150, filters 61, 62, 63, and 64, a bias circuit 50, output terminals 76 and 77, an input terminal 110, and an antenna connection terminal 100 (not illustrated). The radio frequency circuit 1A according to the present modification example is different from the radio frequency circuit 1 according to the embodiment in that two matching circuits 120 and 130 and two filters 61 and 63 are connected to the output terminal 76, and two matching circuits 140 and 150 and two filters 62 and 64 are connected to the output terminal 77. Hereinafter, regarding the radio frequency circuit 1A according to the present modification example, the same points as the radio frequency circuit 1 according to the embodiment are omitted, and different points are mainly described.

The filter 61 is an example of a first filter, and has a pass band that includes band A (first band). An input end of the filter 61 is connected to the matching circuit 120 while passing through a terminal 172.

The filter 62 is an example of a second filter, and has a pass band that includes band B (second band). An input end of the filter 62 is connected to the matching circuit 140 while passing through a terminal 174.

The filter 63 is an example of a third filter, and has a pass band that includes band C (third band). An input end of the filter 63 is connected to the matching circuit 130 while passing through a terminal 173.

The filter 64 is an example of a fourth filter, and has a pass band that includes band D (fourth band). An input end of the filter 64 is connected to the matching circuit 150 while passing through a terminal 175.

The switch 60 is an example of an antenna switch, is connected to the antenna connection terminal 100, switches connection and non-connection of the antenna connection terminal 100 and the filter 61, switches connection and non-connection of the antenna connection terminal 100 and the filter 62, switches connection and non-connection of the antenna connection terminal 100 and the filter 63, and switches connection and non-connection of the antenna connection terminal 100 and the filter 64.

The filters 61 to 64 may include a multiplexer having a common terminal connected to the antenna connection terminal 100, and in this case, the switch 60 does not need to be provided. In addition, based on each of the filters 61 to 64 being for frequency division duplex (FDD), it may constitute a duplexer together with a reception filter, and based on each of the filters 61 to 64 being for time division duplex (TDD), a switch for switching transmission and reception may be disposed at least prior to or subsequent to each filter.

The matching circuit 120 is an example of a first circuit and is connected between the output terminal 76 and the filter 61. The matching circuit 120 has switches 121 and 122, a capacitor 123, and an inductor 124.

The capacitor 123 is an example of a first capacitor and is disposed in series in a first path that connects the output terminal 76 and the filter 61 to each other. The switch 122 is an example of a first switch and is connected between the first path and a ground. The switch 121 is an example of a third switch, the inductor 124 is an example of a first inductor, and the switch 121 and the inductor 124 are connected to each other in series. A series connection circuit of the switch 121 and the inductor 124 is connected to the first path in parallel.

The matching circuit 140 is an example of a second circuit and is connected between the output terminal 77 and the filter 62. The matching circuit 140 has switches 141 and 142, a capacitor 143, and an inductor 144.

The capacitor 143 is an example of a third capacitor and is disposed in series in a second path that connects the output terminal 77 and the filter 62 to each other. The switch 142 is an example of a second switch and is connected between the second path and a ground. The switch 141 is an example of a fifth switch, the inductor 144 is an example of a third inductor, and the switch 141 and the inductor 144 are connected to each other in series. A series connection circuit of the switch 141 and the inductor 144 is connected to the second path in parallel.

The matching circuit 130 is an example of a third circuit and is connected between the output terminal 76 and the filter 63. The matching circuit 130 has switches 131 and 132, a capacitor 133, and an inductor 134.

The capacitor 133 is an example of a second capacitor and is disposed in series in a third path that connects the output terminal 76 and the filter 63 to each other. The switch 132 is an example of a sixth switch and is connected between the third path and a ground. The switch 131 is an example of a fourth switch, the inductor 134 is an example of a second inductor, and the switch 131 and the inductor 134 are connected to each other in series. A series connection circuit of the switch 131 and the inductor 134 is connected to the third path in parallel.

The matching circuit 150 is an example of a fourth circuit and is connected between the output terminal 77 and the filter 64. The matching circuit 150 has switches 151 and 152, a capacitor 153, and an inductor 154.

The capacitor 153 is an example of a fourth capacitor and is disposed in series in a fourth path that connects the output terminal 77 and the filter 64 to each other. The switch 152 is an example of a seventh switch and is connected between the fourth path and a ground. The switch 151 is an example of an eighth switch, the inductor 154 is an example of a fourth inductor, and the switch 151 and the inductor 154 are connected to each other in series. A series connection circuit of the switch 151 and the inductor 154 is connected to the fourth path in parallel.

The matching circuits 120, 130, 140, and 150 may be included in the IC 160.

Each of the switches 121, 122, 131, 132, 141, 142, 151, and 152 is a switch element including, for example, an FET or the like.

According to the above circuit configuration, the radio frequency circuit 1A can transmit the radio frequency signal of any one of band A to band D from the input terminal 110 toward the antenna connection terminal 100. In this case, the switches are not disposed in series in the first path of the matching circuit 120 for transmitting band A, the second path of the matching circuit 140 for transmitting band B, the third path of the matching circuit 130 for transmitting band C, and the fourth path of the matching circuit 150 for transmitting band D, so that it is possible to transmit the radio frequency signal of band A to band D with a low loss.

Next, a relationship between the flows of the radio frequency signals of band A to band D in the radio frequency circuit 1A and the switch operation will be described.

Based on the signal of band A being transmitted, the switches 121 and 122 are in a non-conductive state, the switch 142 is in a conductive state, and the switch 141 is in a non-conductive state. To transmit the signal of band A output from the power amplifiers 10 and 20 to the first path while passing through the output terminal 76, it is necessary to short-circuit the other end of the output-side coil 322. Since there is connection wiring between the other end of the output-side coil 322 and the switch 142, based on the vicinity of the switch 142 being short-circuited to the ground with the switch 142 in a conductive state, the impedance of the other end of the output-side coil 322 is shifted from a short-circuit point by an amount of an inductance component of the connection wiring. On the other hand, the capacitor 143 disposed in series between the switch 142 and the other end of the output-side coil 322 can short-circuit the impedance at the other end of the output-side coil 322 that is shifted from the short-circuit point due to the inductance component of the connection wiring.

Of the capacitor 143 and the switch 142, the capacitor 143 is connected closer to the other end of the output-side coil 322. Accordingly, the impedance at the other end of the output-side coil 322 that is shifted from the short-circuit point by the inductance component of the connection wiring can be accurately set to a short-circuit state.

Further, the switches 131 and 132 of the matching circuit 130 are in a conductive state. Accordingly, in the matching circuit 130, a parallel connection circuit of the inductor 134 and the capacitor 133 is disposed between the output terminal 76 and the ground. The parallel connection circuit (LC resonance circuit) of the inductor 134 and the capacitor 133 functions as a band removal filter through which the signal of band A does not pass. That is, the matching circuit 130 is in an open state with respect to the signal of band A by the switches 131 and 132 that are in a conductive state. As a result, the signal of band A can pass through the first path with a low loss.

In the matching circuit 150, the switches 151 and 152 may be in a conductive state. Accordingly, in the matching circuit 150, a parallel connection circuit of the inductor 154 and the capacitor 153 is disposed between the output terminal 77 and the ground. Thus, the parallel connection circuit (LC resonance circuit) of the inductor 154 and the capacitor 153 can function as a band removal filter through which the signal of band A does not pass. That is, the matching circuit 150 is in an open state with respect to the signal of band A by the switches 151 and 152 that are in a conductive state.

By the above switching operation, the signal of band A output from the power amplifiers 10 and 20 is transmitted from the first path to the filter 61 without passing through the switches disposed in series. Therefore, the radio frequency circuit 1A can transmit the radio frequency signal of band A with a low loss.

Next, based on the signal of band C being transmitted, the switches 131 and 132 are in a non-conductive state, the switch 152 is in a conductive state, and the switch 151 is in a non-conductive state. To transmit the signal of band C output from the power amplifiers 10 and 20 to the third path while passing through the output terminal 76, it is necessary to short-circuit the other end of the output-side coil 322. Since there is connection wiring between the other end of the output-side coil 322 and the switch 152, based on the vicinity of the switch 152 being short-circuited to the ground with the switch 152 in a conductive state, the impedance of the other end of the output-side coil 322 is shifted from a short-circuit point by an amount of an inductance component of the connection wiring. On the other hand, the capacitor 153 disposed in series between the switch 152 and the other end of the output-side coil 322 can short-circuit the impedance at the other end of the output-side coil 322 that is shifted from the short-circuit point due to the inductance component of the connection wiring.

Of the capacitor 153 and the switch 152, the capacitor 153 is connected closer to the other end of the output-side coil 322. Accordingly, the impedance at the other end of the output-side coil 322 that is shifted from the short-circuit point by the inductance component of the connection wiring can be accurately set to a short-circuit state.

Further, the switches 121 and 122 of the matching circuit 120 are in a conductive state. Accordingly, in the matching circuit 120, a parallel connection circuit of the inductor 124 and the capacitor 123 is disposed between the output terminal 76 and the ground. The parallel connection circuit (LC resonance circuit) of the inductor 124 and the capacitor 123 functions as a band removal filter through which the signal of band C does not pass. That is, the matching circuit 120 is in an open state with respect to the signal of band C by the switches 121 and 122 that are in a conductive state. As a result, the signal of band C can pass through the third path with a low loss.

In the matching circuit 140, the switches 141 and 142 may be in a conductive state. Accordingly, in the matching circuit 140, a parallel connection circuit of the inductor 144 and the capacitor 143 is disposed between the output terminal 77 and the ground. Thus, the parallel connection circuit (LC resonance circuit) of the inductor 144 and the capacitor 143 can function as a band removal filter through which the signal of band C does not pass. That is, the matching circuit 140 is in an open state with respect to the signal of band C by the switches 141 and 142 that are in a conductive state.

By the above switching operation, the signal of band C output from the power amplifiers 10 and 20 is transmitted from the third path to the filter 63 without passing through the switches disposed in series. Therefore, the radio frequency circuit 1A can transmit the radio frequency signal of band C with a low loss.

Next, being the signal of band B being transmitted, the switches 141 and 142 are in a non-conductive state, the switch 122 is in a conductive state, and the switch 121 is in a non-conductive state. To transmit the signal of band B output from the power amplifiers 10 and 20 to the second path while passing through the output terminal 77, it is necessary to short-circuit one end of the output-side coil 322. Since there is connection wiring between one end of the output-side coil 322 and the switch 122, even based on the vicinity of the switch 122 being short-circuited to the ground with the switch 122 in a conductive state, the impedance of one end of the output-side coil 322 is shifted from a short-circuit point by an amount of an inductance component of the connection wiring. On the other hand, the capacitor 123 disposed in series between the switch 122 and one end of the output-side coil 322 can short-circuit the impedance at one end of the output-side coil 322 that is shifted from the short-circuit point due to the inductance component of the connection wiring.

Of the capacitor 123 and the switch 122, the capacitor 123 is connected closer to one end of the output-side coil 322. Accordingly, the impedance at one end of the output-side coil 322 that is shifted from the short-circuit point by the inductance component of the connection wiring can be accurately set to a short-circuit state.

Further, the switches 151 and 152 of the matching circuit 150 are in a conductive state. Accordingly, in the matching circuit 150, a parallel connection circuit of the inductor 154 and the capacitor 153 is disposed between the output terminal 77 and the ground. The parallel connection circuit (LC resonance circuit) of the inductor 154 and the capacitor 153 functions as a band removal filter through which the signal of band B does not pass. That is, the matching circuit 150 is in an open state with respect to the signal of band B by the switches 151 and 152 that are in a conductive state. As a result, the signal of band B can pass through the second path with a low loss.

In the matching circuit 130, the switches 131 and 132 may be in a conductive state. Accordingly, in the matching circuit 130, a parallel connection circuit of the inductor 134 and the capacitor 133 is disposed between the output terminal 76 and the ground. Thus, the parallel connection circuit (LC resonance circuit) of the inductor 134 and the capacitor 133 can function as a band removal filter through which the signal of band B does not pass. That is, the matching circuit 130 is in an open state with respect to the signal of band B by the switches 131 and 132 that are in a conductive state.

By the above switching operation, the signal of band B output from the power amplifiers 10 and 20 is transmitted from the second path to the filter 62 without passing through the switches disposed in series. Therefore, the radio frequency circuit 1A can transmit the radio frequency signal of band B with a low loss.

Next, based on the signal of band D being transmitted, the switches 151 and 152 are in a non-conductive state, the switch 132 is in a conductive state, and the switch 131 is in a non-conductive state. To transmit the signal of band D output from the power amplifiers 10 and 20 to the fourth path while passing through the output terminal 77, it is necessary to short-circuit one end of the output-side coil 322. Since there is connection wiring between one end of the output-side coil 322 and the switch 132, based the vicinity of the switch 132 being short-circuited to the ground with the switch 132 in a conductive state, the impedance of one end of the output-side coil 322 is shifted from a short-circuit point by an amount of an inductance component of the connection wiring. On the other hand, the capacitor 133 disposed in series between the switch 132 and one end of the output-side coil 322 can short-circuit the impedance at one end of the output-side coil 322 that is shifted from the short-circuit point due to the inductance component of the connection wiring.

Of the capacitor 133 and the switch 132, the capacitor 133 is connected closer to one end of the output-side coil 322. Accordingly, the impedance at one end of the output-side coil 322 that is shifted from the short-circuit point by the inductance component of the connection wiring can be accurately set to a short-circuit state.

Further, the switches 141 and 142 of the matching circuit 140 are in a conductive state. Accordingly, in the matching circuit 140, a parallel connection circuit of the inductor 144 and the capacitor 143 is disposed between the output terminal 77 and the ground. The parallel connection circuit (LC resonance circuit) of the inductor 144 and the capacitor 143 functions as a band removal filter through which the signal of band D does not pass. That is, the matching circuit 140 is in an open state with respect to the signal of band D by the switches 141 and 142 that are in a conductive state. As a result, the signal of band D can pass through the fourth path with a low loss.

In the matching circuit 120, the switches 121 and 122 may be in a conductive state. Accordingly, in the matching circuit 120, a parallel connection circuit of the inductor 124 and the capacitor 123 is disposed between the output terminal 76 and the ground. Thus, the parallel connection circuit (LC resonance circuit) of the inductor 124 and the capacitor 123 can function as a band removal filter through which the signal of band D does not pass. That is, the matching circuit 120 is in an open state with respect to the signal of band D by the switches 121 and 122 that are in a conductive state.

By the above switching operation, the signal of band D output from the power amplifiers 10 and 20 is transmitted from the fourth path to the filter 64 without passing through the switches disposed in series. Therefore, the radio frequency circuit 1A can transmit the radio frequency signal of band D with a low loss.

In this case, the capacitor 123 of the matching circuit 120 functions as an element for adjusting a phase (impedance) at one end of the output-side coil 322 based on the signal of band C being transmitted, and functions as an element for LC parallel resonance circuit in order to secure isolation between the first path and the second path based on the signal of band C being transmitted. In addition, the capacitor 133 of the matching circuit 130 functions as an element for adjusting a phase (impedance) at one end of the output-side coil 322 based on the signal of band D being transmitted, and functions as an element for LC parallel resonance circuit in order to secure isolation between the first path and the second path based on the signal of band A being transmitted. In addition, the capacitor 143 of the matching circuit 140 functions as an element for adjusting a phase (impedance) at the other end of the output-side coil 322 based on the signal of band A being transmitted, and functions as an element for LC parallel resonance circuit in order to secure isolation between the third path and the fourth path based on the signal of band D being transmitted. In addition, the capacitor 153 of the matching circuit 150 functions as an element for adjusting a phase (impedance) at the other end of the output-side coil 322 based on the signal of band C being transmitted, and functions as an element for LC parallel resonance circuit in order to secure isolation between the third path and the fourth path based on the signal of band B being transmitted.

That is, since each of the capacitors 123, 133, 143, and 153 is a multifunctional element that serves a plurality of functions, the number of circuit elements of the matching circuits 120 to 150 can be reduced. Therefore, the size of the radio frequency circuit 1A is reduced.

In the radio frequency circuit 1A according to the present modification example, the switches 132 and 141, the capacitor 143, the inductor 144, the matching circuit 150, and the filter 64 do not need to be provided. However, in this case, it is required that the switch 142 is disposed in the vicinity of the other end of the output-side coil 322, frequencies of the band A and the band C do not overlap each other, and a sufficient frequency interval is ensured. The operation of the circuit configuration will be described below.

First, based on the signal of band A being transmitted, the switches 121 and 122 are in a non-conductive state, and the switch 142 is in a conductive state. Accordingly, the impedance at the other end of the output-side coil 322 can be set to a short-circuit state.

Further, the switch 131 of the matching circuit 130 is in a conductive state. Accordingly, in the matching circuit 130, a parallel connection circuit of the inductor 134 and the capacitor 133 is disposed between the output terminal 76 and the terminal 173. The parallel connection circuit of the inductor 134 and the capacitor 133 functions as a filter through which the signal of band A does not pass. That is, the matching circuit 130 is in an open state with respect to the signal of band A by the switch 131 that is in a conductive state. As a result, the signal of band A can pass through the first path with a low loss.

Next, based on the signal of band C being transmitted, the switch 131 is in a non-conductive state, and the switch 142 is in a conductive state. Accordingly, the impedance at the other end of the output-side coil 322 can be set to a short-circuit state.

Further, the switches 121 and 122 of the matching circuit 120 are in a conductive state. Accordingly, in the matching circuit 120, a parallel connection circuit of the inductor 124 and the capacitor 123 is disposed between the output terminal 76 and the ground. The parallel connection circuit of the inductor 124 and the capacitor 123 functions as a band removal filter through which the signal of band C does not pass. That is, the matching circuit 120 is in an open state with respect to the signal of band C by the switches 121 and 122 that are in a conductive state. As a result, the signal of band C can pass through the third path with a low loss.

Next, based on the signal of band B being transmitted, the switch 142 is in a non-conductive state, and the switch 122 is in a conductive state. To transmit the signal of band B output from the power amplifiers 10 and 20 to the second path while passing through the output terminal 77, it is necessary to short-circuit one end of the output-side coil 322. On the other hand, the capacitor 123 disposed in series between the switch 122 and one end of the output-side coil 322 can short-circuit the impedance at one end of the output-side coil 322 that is shifted from the short-circuit point due to the inductance component of the connection wiring between one end of the output-side coil 322 and the switch 122.

By the above operation, the signal of band A can pass through the first path with a low loss, the signal of band B can pass through the second path with a low loss, and the signal of band C can pass through the third path with a low loss.

Therefore, it is possible to provide the radio frequency circuit 1A having a plurality of amplification elements and a plurality of transformers, which can transmit the radio frequency signals of band A to band C with a low loss.

[1.5 Circuit Configuration of Radio Frequency Circuit 1B According to Modification Example 3]

Figure 6:
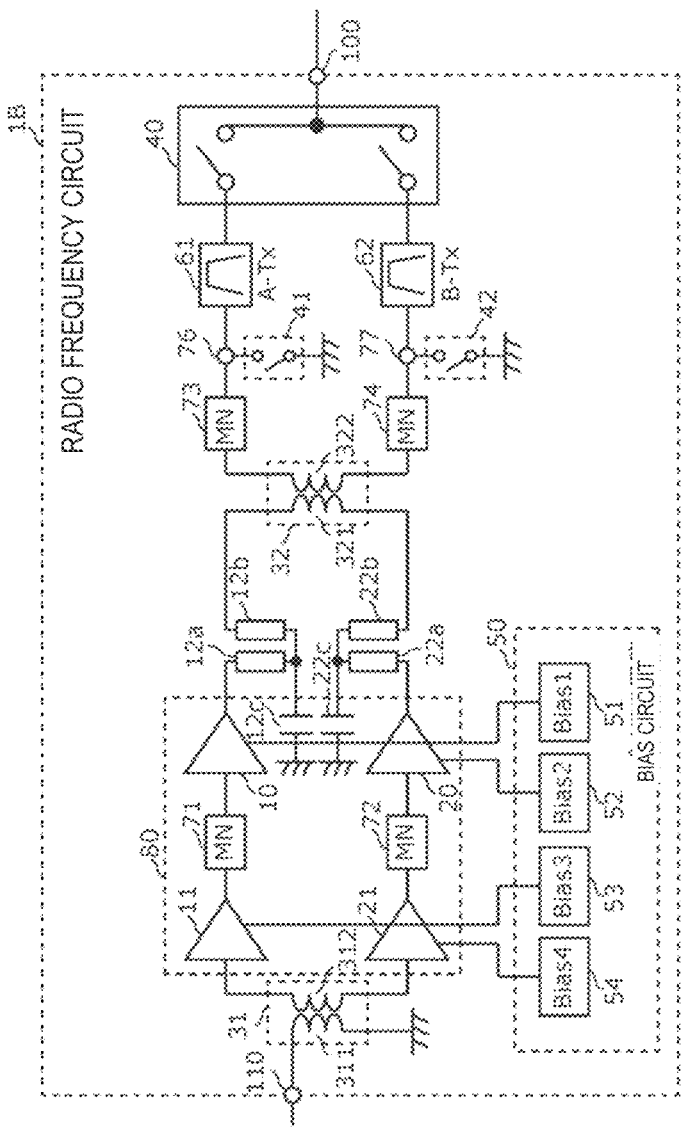
FIG. 6 is a circuit configuration diagram of a radio frequency circuit according to Modification Example 3 of the embodiment.

FIG. 6 is a circuit configuration diagram of a radio frequency circuit 1B according to Modification Example 3 of the embodiment. As illustrated in FIG. 6, the radio frequency circuit 1B includes power amplifiers 10 and 20, preamplifiers 11 and 21, phase shift lines 12a, 12b, 22a, and 22b, capacitors 12c and 22c, transformers 31 and 32, matching circuits 71, 72, 73, and 74, switches 40, 41, and 42, filters 61 and 62, a bias circuit 50, output terminals 76 and 77, an input terminal 110, and an antenna connection terminal 100. The radio frequency circuit 1B according to the present modification example is mainly different in configurations of the phase shift circuits connected to the output terminals of the power amplifiers 10 and 20, as compared with the radio frequency circuit 1 according to the embodiment. Hereinafter, regarding the radio frequency circuit 1B according to the present modification example, the same points as the radio frequency circuit 1 according to the embodiment are omitted, but the different points are mainly described.

The phase shift lines 12a and 12b and the capacitor 12c constitute a first phase shift circuit, and shift a phase of the input signal by approximately −90 degrees (delays by 90 degrees). The phase shift line 12a is an example of a first phase shift line, and has one end connected to the output terminal of the power amplifier 10 and the other end connected to one end of the phase shift line 12b. The phase shift line 12b is an example of a second phase shift line, and has one end connected to the other end of the phase shift line 12a and the other end connected to one end of the input-side coil 321. The capacitor 12c is an example of a ninth capacitor, and has one end (one electrode) connected to a connection point of the other end of the phase shift line 12a and one end of the phase shift line 12b, and the other end (the other electrode) connected to a ground.

With the above configuration, the capacitor 12c is connected between the connection point of the ground and the phase shift lines 12a and 12b, so that the total line length of the phase shift lines 12a and 12b can be set to be shorter than ¼ wavelength, thereby reducing the size of the radio frequency circuit 1B.

The phase shift lines 22a and 22b and the capacitor 22c constitute a second phase shift circuit, and shift a phase of the input signal by approximately −90 degrees (delays by 90 degrees). The phase shift line 22a is an example of a third phase shift line, and has one end connected to the output terminal of the power amplifier 20 and the other end connected to one end of the phase shift line 22b. The phase shift line 22b is an example of a fourth phase shift line, and has one end connected to the other end of the phase shift line 22a and the other end connected to the other end of the input-side coil 321. The capacitor 22c is an example of a tenth capacitor, and has one end (one electrode) connected to a connection point of the other end of the phase shift line 22a and one end of the phase shift line 22b, and the other end (the other electrode) connected to a ground.

With the above configuration, the capacitor 22c is connected between the connection point of the ground and the phase shift lines 22a and 22b, so that the total line length of the phase shift lines 22*a* and 22*b* can be set to be shorter than ¼ wavelength, thereby reducing the size of the radio frequency circuit 1B.

The power amplifiers 10 and 20, the preamplifiers 11 and 21, and the matching circuits 71 and 72 may be included in the semiconductor IC 80. In this case, the capacitors 12*c* and 22*c* may be included in the semiconductor IC 80.

Accordingly, the capacitors 12*c* and 22*c* are built in the semiconductor IC 80 together with the power amplifiers 10 and 20, so that the size of the radio frequency circuit 1B can be reduced.

Further, the capacitors 12*c* and 22*c* may be disposed between the power amplifier 10 and the power amplifier 20 in the semiconductor IC 80. Accordingly, a space of the semiconductor IC 80 can be effectively used, so that it is possible to contribute to the size of the radio frequency circuit 1B.

In the radio frequency circuit 1B according to the present modification example, both the first phase shift circuit and the second phase shift circuit have two phase shift lines and two capacitors, but at least one of the first phase shift circuit and the second phase shift circuit may have two phase shift lines and two capacitors.

2. Mounting Configuration of Radio Frequency Circuit 1

A mounting configuration of the radio frequency circuit 1 according to the present embodiment will be described with reference to FIGS. 7A and 7B.

Figure 7A:
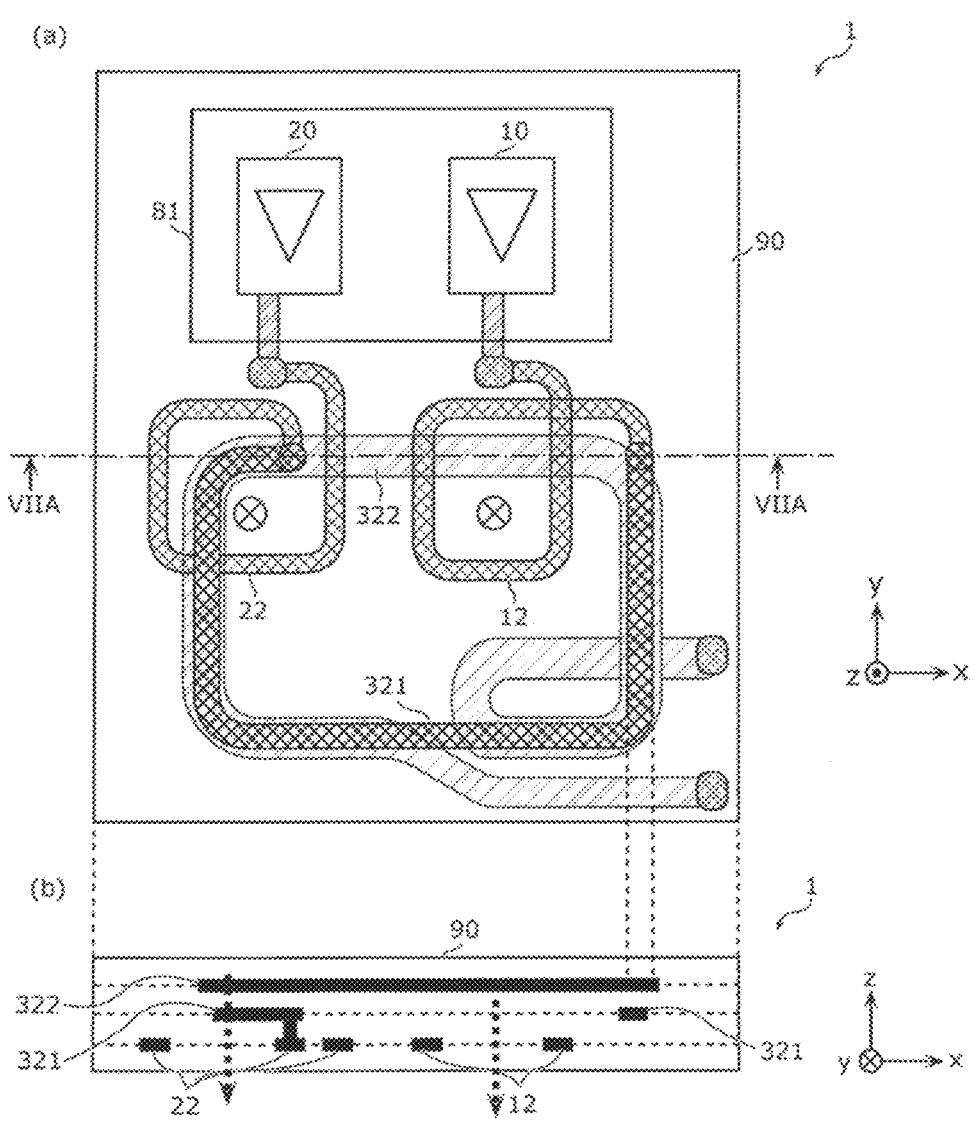
FIG. 7A is a plan view and a sectional view of a radio frequency circuit according to Example 1.

FIG. 7A is a plan view and a sectional view of the radio frequency circuit 1 according to Example 1. (a) of FIG. 7A is a plan view of the radio frequency circuit 1 according to Example 1, and is a perspective view of a main surface of the module substrate 90 as viewed from a positive side of the z-axis, and (b) of FIG. 7A is a sectional view of the radio frequency circuit 1 according to Example 1. The cross section of the radio frequency circuit 1 in (b) of FIG. 7A is a cross section taken along line VIIA-VIIA in (a) of FIG. 7A. In addition, in (a) of FIG. 7A, a mark indicating a function of the power amplifiers 10 and 20 so as to easily understand the arrangement relationship thereof, but the mark is not added to each actual amplifier. In addition, in FIG. 7A, the module substrate 90 and wiring that connects each circuit component are not illustrated.

The radio frequency circuit 1 illustrated in FIG. 7A may further include a resin member that covers a surface of the module substrate 90 and a part of the circuit component, and a shield electrode layer that covers a surface of the resin member, but in FIG. 7A, the resin member and the shield electrode layer are not illustrated.

The radio frequency circuit 1 further has the module substrate 90 in addition to the circuit configuration illustrated in FIG. 1A. In addition, the preamplifiers 11 and 21, the transformer 31, the matching circuits 71 to 74, the switches 40 to 42, and the filters 61 and 62 included in the radio frequency circuit 1 are not illustrated in FIG. 7A, but may be disposed on the module substrate 90.

The module substrate 90 is a substrate on which circuit components constituting the radio frequency circuit 1 are mounted. As the module substrate 90, for example, a low temperature co-fired ceramics (LTCC) substrate having a stacked structure of a plurality of dielectric layers, a high temperature co-fired ceramics (HTCC) substrate, a component built-in substrate, a substrate having a redistribution layer (RDL), a printed substrate, or the like is used.

The power amplifiers 10, 20, and the like are disposed on the surface of the module substrate 90.

The power amplifiers 10 and 20 are included in a semiconductor IC 81. The semiconductor IC 81 is disposed on the module substrate 90. The semiconductor IC 81 is formed using, for example, a complementary metal oxide semiconductor (CMOS), and specifically, may be manufactured by a silicon on insulator (SOI) process. In addition, the semiconductor IC 81 may be formed of at least one of GaAs, SiGe, and GaN. A semiconductor material of the semiconductor IC 81 is not limited to the above-described material. At least one of the preamplifiers 11 and 21, the matching circuits 71 and 72, and the switches 41 and 42 may be included in the semiconductor IC 81.

The phase shift line 12 (fifth phase shift line) and 22 (sixth phase shift line), the input-side coil 321, and the output-side coil 322 are formed on a surface of the module substrate 90 or inside the module substrate 90. The phase shift lines 12 and 22, the input-side coil 321, and the output-side coil 322 are composed of a plane conductor that is formed on the surface of the module substrate 90 or inside the module substrate 90. The phase shift lines 12 and 22, the input-side coil 321, and the output-side coil 322 may be formed on the same layer of the module substrate 90 or different layers. Further, each of the phase shift lines 12 and 22, the input-side coil 321, and the output-side coil 322 may be formed over a plurality of layers.

In this case, a winding direction of the phase shift line 12 is the same as a winding direction of the phase shift line 22 based on the module substrate 90 being viewed in a plan view.

Accordingly, since the winding direction of the phase shift line 12 is the same as the winding direction of the phase shift line 22, and as illustrated in FIG. 7A, a magnetic flux direction of the phase shift line 12 is the same as a magnetic flux direction of the phase shift line 22. Therefore, as compared with a case in which the magnetic flux direction of the phase shift line 12 is opposite to the magnetic flux direction of the phase shift line 22, a magnetic field coupling between the phase shift line 12 and the phase shift line 22 can be suppressed. Thus, a transmission loss of the radio frequency signal transmitted through the radio frequency circuit 1 can be reduced.

Figure 7B:
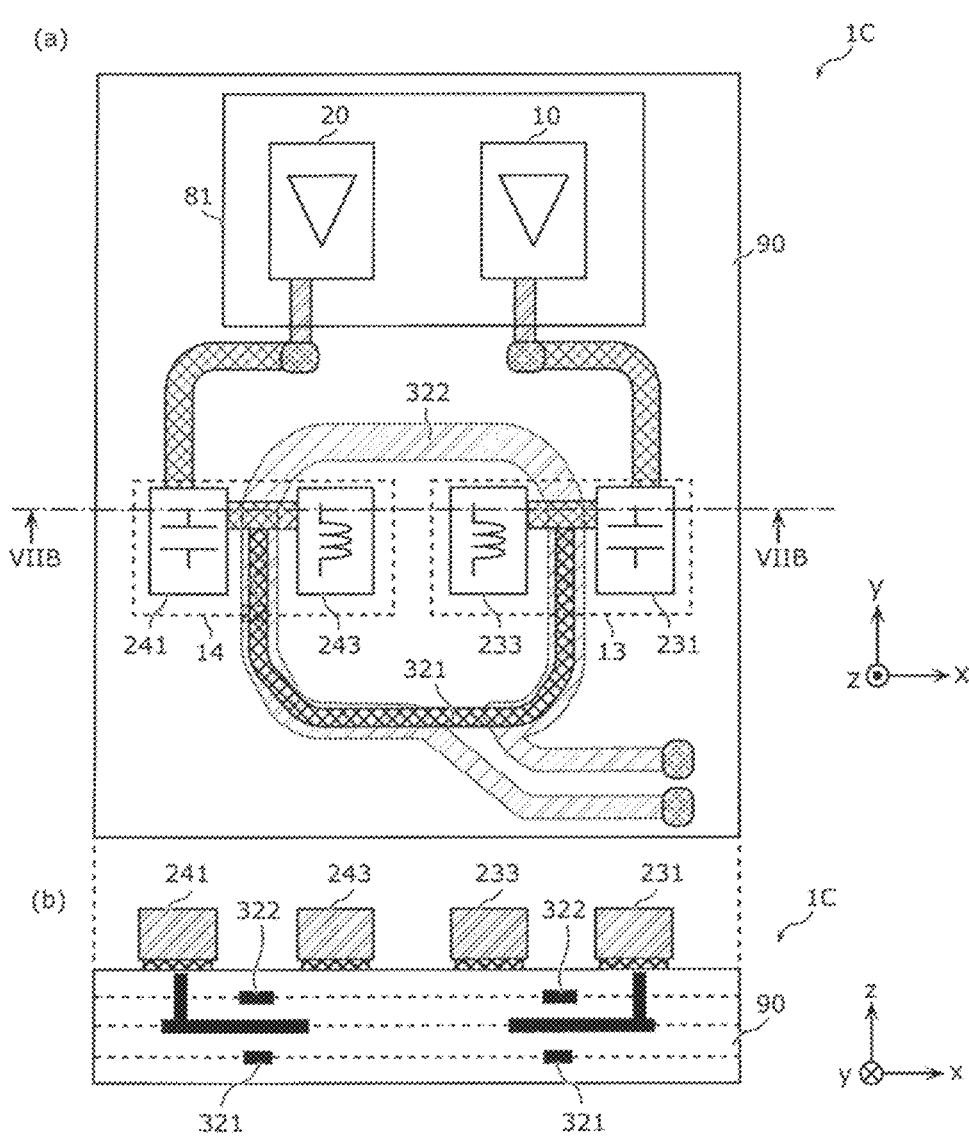
FIG. 7B is a plan view and a sectional view of a radio frequency circuit according to Example 2.

FIG. 7B is a plan view and a sectional view of the radio frequency circuit 1C according to Example 2. (a) of FIG. 7B is a plan view of the radio frequency circuit 1C according to Modification Example 1, and is a perspective view of a main surface of the module substrate 90 as viewed from a positive side of the z-axis, and (b) of FIG. 7B is a sectional view of the radio frequency circuit 1C according to Modification Example 1. The cross section of the radio frequency circuit 1C in (b) of FIG. 7B is a cross section taken along line VIIB-VIIB in (a) of FIG. 7B. In addition, in (a) of FIG. 7B, a mark indicating a function of the power amplifiers 10 and 20 so as to easily understand the arrangement relationship thereof, but the mark is not added to each actual amplifier. In addition, in FIG. 7B, the module substrate 90 and wiring that connects each circuit component are not illustrated. The radio frequency circuit 1C according to the present example is different in a configuration of the phase shift circuit, as compared with the radio frequency circuit 1 according to Example 1. Hereinafter, regarding the radio frequency circuit 1C according to the present example, the same points as the radio frequency circuit 1 according to Example 1 are omitted, and different points are mainly described.

The radio frequency circuit 1C further has the module substrate 90 in addition to the circuit configuration illustrated in FIG. 1B. In addition, the preamplifiers 11 and 21, the transformer 31, the matching circuits 71 to 74, the switches 40 to 42, and the filters 61 and 62 included in the radio frequency circuit 1C are not illustrated in FIG. 7B, but may be disposed on the module substrate 90.

The phase shift circuits 13 and 14, the input-side coil 321, and the output-side coil 322 are formed on the surface of the module substrate 90 or inside the module substrate 90. The capacitors 231 and 232 (not illustrated) and the inductors 233 and 234 (not illustrated), which constitute the phase shift circuit 13, are chip-shaped circuit components, for example, surface-mounted type components, and are disposed on the surface of the module substrate 90. The capacitors 241 and 242 (not illustrated) and the inductors 243 and 244 (not illustrated), which constitute the phase shift circuit 14, are chip-shaped circuit components, for example, surface-mounted type components, and are disposed on the surface of the module substrate 90. The input-side coil 321 and the output-side coil 322 are composed of a plane conductor that is formed on the surface of the module substrate 90 or inside the module substrate 90. The input-side coil 321 and the output-side coil 322 may be formed on the same layer of the module substrate 90 or different layers. In addition, each of the input-side coil 321 and the output-side coil 322 may be formed over a plurality of layers.

In the present example, based on the module substrate 90 being viewed in a plan view, the inductors 233 and 243 are disposed inside the input-side coil 321 and the output-side coil 322, and the capacitors 231 and 241 are disposed outside the input-side coil 321 and the output-side coil 322.

In one option, the winding direction of the inductor 233 (and 234) is the same as the winding direction of the inductor 243 (and 244). Accordingly, as compared with a case in which the winding direction of inductor 233 (and 234) is opposite to the winding direction of the inductor 243 ((and) 244), a magnetic field coupling between the phase shift circuit 13 and the phase shift circuit 14 can be suppressed. Thus, a transmission loss of the radio frequency signal transmitted through the radio frequency circuit 1C can be reduced.

3. Effect, and the Like

As described above, the radio frequency circuit 1 according to the present embodiment includes the power amplifiers 10 and 20, the transformer 32 having the input-side coil 321 and the output-side coil 322, the bias circuit 50 connected to the power amplifiers 10 and 20, the output terminal 76 connected to one end of the output-side coil 322, the output terminal 77 connected to the other end of the output-side coil 322, the switch 41 connected between the output terminal 76 and the ground, the switch 42 connected between the output terminal 77 and the ground, the phase shift line 12 having the input end connected to the output terminal of the power amplifier 10 and the output end connected to one end of the input-side coil 321, and the phase shift line 22 having the input end connected to the output terminal of the power amplifier 20 and the output end connected to the other end of the input-side coil 321.

Accordingly, the power amplifiers 10 and 20 can be exclusively switched to the carrier amplifier and the peak amplifier by changing the magnitude of the bias voltage supplied from the bias circuit 50 to the power amplifiers 10 and 20. The carrier amplifier deteriorates more easily than the peak amplifier. The conduction and the non-conduction of the switches 41 and 42 are exclusively switched in conjunction with the above switching, so that, for example, based on the power amplifier 10 being operated as the carrier amplifier and the power amplifier 20 being operated as the peak amplifier, the radio frequency signal amplified and synthesized by the power amplifiers 10 and 20 is output from the output terminal 76, and based on the power amplifier 20 being operated as the carrier amplifier and the power amplifier 10 being operated as the peak amplifier, the radio frequency signal amplified and synthesized by the power amplifiers 10 and 20 can be output from the output terminal 77. Thus, since any one of the power amplifier 10 or 20 can be fixed to the carrier amplifier that is easily deteriorated so as to avoid operating, it is possible to provide the radio frequency circuit 1 having the Doherty-type power amplifier with suppressed deterioration of the power amplifiers 10 and 20.

In addition, for example, in the radio frequency circuit 1, the bias circuit 50 may include the bias supply circuit 51 that changes the first bias voltage supplied to the power amplifier 10 in synchronization with the timing of switching between the conduction and the non-conduction of the switches 41 and 42, and the bias supply circuit 52 that changes the second bias voltage supplied to the power amplifier 20 in synchronization with the timing of switching between the conduction and the non-conduction of the switches 41 and 42, and the voltage value of the first bias voltage may different from a voltage value of the second bias voltage.

Accordingly, based on the power amplifier 10 being operated as the carrier amplifier, the bias supply circuit 51 supplies the first bias voltage having a relatively large voltage value to the power amplifier 10. In addition, based on the power amplifier 20 being operated as the peak amplifier, the bias supply circuit 52 supplies the second bias voltage having a smaller voltage value than the first bias voltage to the power amplifier 20. In addition, based on the power amplifier 10 being operated as the peak amplifier, the bias supply circuit 51 supplies the first bias voltage having a relatively small voltage value to the power amplifier 10. In addition, based on the power amplifier 20 being operated as the carrier amplifier, the bias supply circuit 52 supplies the second bias voltage having a larger voltage value than the first bias voltage to the power amplifier 20. Therefore, the power amplifiers 10 and 20 can be exclusively switched to the carrier amplifier and the peak amplifier by the bias circuit 50.

Further, for example, the radio frequency circuit 1 may further include the filter 61 connected to the output terminal 76 and having the pass band including band A, and the filter 62 connected to the output terminal 77 and having the pass band including band B.

Accordingly, for example, the signal of band A can output from the output terminal 76 by using the power amplifier 10 as the carrier amplifier and the power amplifier 20 as the peak amplifier, and the signal of band B can be output from the output terminal 77 by using the power amplifier 20 as the carrier amplifier and the power amplifier 10 as the peak amplifier. In this case, the switch 41, which is disposed in the signal path that connects the output terminal 76 and the filter 61 to each other, is shunt-connected to the ground, so that a transmission loss of the signal of band A due to on-resistance of the switch can be avoided. In addition, the switch 42, which is disposed in the signal path that connects the output terminal 77 and the filter 62 to each other, is shunt-connected to the ground, so that a transmission loss of the signal of band B due to on-resistance of the switch can be avoided.

Further, for example, the radio frequency circuit 1A may include the filter 61 having the pass band including band A, the filter 62 having the pass band including band B, the filter 63 having the pass band including band C, the matching circuit 120 connected between the output terminal 76 and the filter 61, the matching circuit 140 connected between the output terminal 77 and the filter 62, and the matching circuit 130 connected between the output terminal 76 and the filter 63, in which the matching circuit 120 may include the capacitor 123 disposed in series in the first path that connects the output terminal 76 and the filter 61 to each other to each other, the switch 122 connected between the first path and the ground, and the switch 121 and the inductor 124 connected to each other in series, the series connection circuit of the switch 121 and the inductor 124 may be connected to the first path in parallel, the matching circuit 140 may have the switch 142 connected between the ground and the second path that connects the output terminal 77 and the filter 62 to each other, the matching circuit 130 may have the capacitor 133 disposed in series in the third path that connects the output terminal 76 and the filter 63 to each other, and the switch 131 and the inductor 134 connected to each other in series, and the series connection circuit of the switch 131 and the inductor 134 may be connected to the third path in parallel.

Accordingly, the signal of band A can pass through the first path with a low loss without passing through the switches disposed in series, and the signal of band B can pass through the second path with a low loss without passing through the switches disposed in series, and the signal of band C can pass through the third path with a low loss without passing through the switches disposed in series. Thus, it is possible to provide the radio frequency circuit 1A that can transmit the radio frequency signals of a plurality of band A to band C with a low loss.

Further, for example, in the radio frequency circuit 1A, of the capacitor 123 and the switch 122, the capacitor 123 may be connected closer to the output terminal 76.

Accordingly, the impedance at one end of the output-side coil 322 that is shifted from the short-circuit point by the inductance component of the connection wiring, which connects one end of the output-side coil 322 and the switch 122 to each other, can be set to a short-circuit state.

Further, for example, the radio frequency circuit 1A may further include the filter 64 having the pass band including band D, and the matching circuit 150 connected between the output terminal 77 and the filter 64, in which the matching circuit 140 may further include the capacitor 143 disposed in series in the second path, and the switch 141 and the inductor 144 connected to each other in series, the series connection circuit of the switch 141 and the inductor 144 may be connected to the second path in parallel, the matching circuit 130 may further include the switch 132 connected between the third path and the ground, the matching circuit 150 may have the capacitor 153 disposed in series in the fourth path that connects the output terminal 77 and the filter 64 to each other, a switch 152 connected between the fourth path and the ground, and the switch 151 and the inductor 154 connected to each other in series, in which the series connection circuit of the switch 151 and the inductor 154 may be connected to the fourth path in parallel.

Accordingly, it is possible to transmit the radio frequency signals of band A to band D with a low loss.

Further, for example, in the radio frequency circuit 1, the power amplifiers 10 and 20 may be different in size from each other.

Accordingly, the back-off amount can be changed according to the switching of the carrier amplifier and the peak amplifier of the power amplifiers 10 and 20.

Further, for example, in the radio frequency circuit 1C, the phase shift circuit 13 may have the capacitor 231 connected to the output terminal of the power amplifier 10, the capacitor 232 connected in series to the capacitor 231 between the output terminal of the power amplifier 10 and one end of the input-side coil 321, the inductor 233 connected between the ground and the connection point of the capacitor 231 and the capacitor 232, and the inductor 234 connected between the ground and the connection point of the capacitor 232 and one end of the input-side coil 321.

Accordingly, the phase shift circuit 13 can delay the phase of the radio frequency signal input from one end of the capacitor 231 and output the phase from the other end of the capacitor 232.

Further, for example, in the radio frequency circuit 1C, the phase shift circuit 14 may have the capacitor 241 connected to the output terminal of the power amplifier 20, the capacitor 242 connected in series to the capacitor 241 between the output terminal of the power amplifier 20 and the other end of the input-side coil 321, the inductor 243 connected between the ground and the connection point of the capacitor 241 and the capacitor 242, and the inductor 244 connected between the ground and the connection point of the capacitor 242 and the other end of the input-side coil 321.

Accordingly, the phase shift circuit 14 can delay the phase of the radio frequency signal input from one end of the capacitor 241 and output the phase from the other end of the capacitor 242.

Further, for example, in the radio frequency circuit 1B, the first phase shift circuit may have phase shift lines 12a and 12b, and a capacitor 12c, in which one end of the phase shift line 12a may be connected to the output terminal of the power amplifier 10, the other end of the phase shift line 12a may be connected to one end of the phase shift line 12b, the other end of the phase shift line 12b may be connected to one end of the input-side coil 321, one end of the capacitor 12c may be connected to a connection point of the other end of the phase shift line 12a and one end of the phase shift line 12b, and the other end of the capacitor 12c may be connected to the ground.

Accordingly, by disposing the capacitor 12c, the total line length of the phase shift lines 12a and 12b for delaying the phase of the radio frequency signal amplified by the power amplifier 10 by 90 degrees can be set to be shorter than ¼ wavelength, so that the size of the radio frequency circuit 1B can be reduced.

Further, for example, in the radio frequency circuit 1B, the second phase shift circuit may have the phase shift lines 22a and 22b, and the capacitor 22c, in which one end of the phase shift line 22a may be connected to the output terminal of the power amplifier 20, the other end of the phase shift line 22a may be connected to one end of the phase shift line 22b, the other end of the phase shift line 22b may be connected to the other end of the input-side coil 321, one end of the capacitor 22c may be connected to the connection point of the other end of the phase shift line 22a and one end of the phase shift line 22b, and the other end of the capacitor 22c may be connected to the ground.

Accordingly, by disposing the capacitor 22c, the total line length of the phase shift lines 22a and 22b for delaying the phase of the radio frequency signal amplified by the power amplifier 20 by 90 degrees can be set to be shorter than ¼ wavelength, so that the size of the radio frequency circuit 1B can be reduced.

Further, for example, the radio frequency circuit 1 may include a module substrate 90, the power amplifiers 10 and 20 may be included in the semiconductor IC 80 disposed on the main surface of the module substrate 90, and the capacitors 12c and 22c may be included in the semiconductor IC 80.

Accordingly, the size of the radio frequency circuit 1 can be reduced.

Further, for example, the radio frequency circuit 1 may further include the module substrate 90, the first phase shift circuit may include at least a phase shift line 12, the second phase shift circuit may include at least the phase shift line 22, the input-side coil 321, the output-side coil 322, and the phase shift lines 12 and 22 may be composed of the plane conductor that is formed on a surface of the module substrate 90 or inside the module substrate 90, and the winding direction of the phase shift line 12 may be the same as the winding direction of the phase shift line 22 based on the module substrate 90 being viewed in a plan view.

Accordingly, as compared with a configuration in which the winding direction of the phase shift line 12 is opposite to the winding direction of the phase shift line 22, a magnetic field coupling between the phase shift line 12 and the phase shift line 22 can be suppressed. Thus, a transmission loss of the radio frequency signal transmitted through the radio frequency circuit 1 can be reduced.

Further, the communication device 4 according to the present embodiment includes the RFIC 3 that processes the radio frequency signal, and the radio frequency circuit 1 that transmits the radio frequency signal between the RFIC 3 and the antenna 2.

Accordingly, the communication device 4 can implement the effect of the radio frequency circuit 1.

Further, in a power amplification method for the radio frequency circuit 1 according to the present embodiment, based on the switch 41 being in a non-conductive state and the switch 42 being in a conductive state, the first bias voltage is supplied from the bias circuit 50 to the power amplifier 10, and the second bias voltage having a smaller voltage value than the first bias voltage, is supplied from the bias circuit 50 to the power amplifier 20, and based on the switch 41 being in a conductive state and the switch 42 being in a non-conductive state, the first bias voltage is supplied from the bias circuit 50 to the power amplifier 10, and the second bias voltage having a larger voltage value than the first bias voltage, is supplied from the bias circuit 50 to the power amplifier 20.

Accordingly, the power amplifiers 10 and 20 can be exclusively switched to the carrier amplifier and the peak amplifier by changing the magnitude of the bias voltage supplied from the bias circuit 50 to the power amplifiers 10 and 20. The conduction and the non-conduction of the switches 41 and 42 are exclusively switched in conjunction with the above switching, so that, for example, based on the power amplifier 10 being operated as the carrier amplifier and the power amplifier 20 being operated as the peak amplifier, the radio frequency signal amplified and synthesized by the power amplifiers 10 and 20 is output from the output terminal 76, and based on the power amplifier 20 being operated as the carrier amplifier and the power amplifier 10 being operated as the peak amplifier, the radio frequency signal amplified and synthesized by the power amplifiers 10 and 20 can be output from the output terminal 77. Thus, since any one of the power amplifier 10 or 20 can be fixed to the carrier amplifier that is easily deteriorated so as to avoid operating, it is possible to suppress deterioration of the radio frequency circuit 1.

Further, in the power amplification method for the radio frequency circuit 1 according to the present embodiment, based on the switch 41 being in a non-conductive state and the switch 42 being in a conductive state, the power amplifier 10 is operated in class AB or class A, and the power amplifier 20 is operated in class C, and based on the switch 41 being in a conductive state and the switch 42 being in a non-conductive state, the power amplifier 20 is operated in class AB or class A, and the power amplifier 10 is operated in class C.

Accordingly, the conduction and non-conduction of the switches 41 and 42 are exclusively switched in conjunction with the switching of the operations of the power amplifiers 10 and 20 in class AB/class C, so that, for example, based on the power amplifier 10 being operated in class AB and the power amplifier 20 being operated in class C, the radio frequency signal amplified and synthesized by the power amplifiers 10 and 20 is output from the output terminal 76, and based on the power amplifier 20 being operated in class AB and the power amplifier 10 being operated in class C, the radio frequency signal amplified and synthesized by the power amplifiers 10 and 20 can be output from the output terminal 77. Thus, since any one of the power amplifier 10 or 20 can be fixed to the carrier amplifier that is easily deteriorated so as to avoid operating, it is possible to suppress deterioration of the radio frequency circuit 1.

Other Embodiments, and the Like

Although the radio frequency circuit, the communication device, and the power amplification method for a radio frequency circuit according to the embodiments of the present disclosure have been described by giving of the embodiments, the examples, and the modification examples, the radio frequency circuit, the communication device, and the power amplification method for a radio frequency circuit according to the present disclosure are not limited to the embodiments, the examples, and the modification examples. Other embodiments which are realized by combining any constituent elements in the above embodiments, examples and modification examples, and variations which can be obtained by applying various changes on the above embodiments by a person skilled in the art without necessarily departing from the gist of the present disclosure, and various devices incorporating the radio frequency circuit and the communication device are also included in the present disclosure.

For example, in the radio frequency circuit according to the above modification example, each of the matching circuits 120 to 150 has a capacitor, an inductor, and two switches, but the present disclosure is not limited thereto. Each of the matching circuits 120, 130, 140, and 150 may have a circuit element in addition to the capacitor, the inductor, and the two switches.

Further, for example, in the radio frequency circuit and communication device according to the above embodiments, examples, and modification examples, another circuit element, wiring, or the like may be inserted between the paths that connect each of the circuit elements and the signal paths illustrated in the drawings.

INDUSTRIAL APPLICABILITY

The present disclosure can be widely used in a communication device, such as a mobile phone as a radio frequency circuit disposed in a front end portion supporting multiband.

REFERENCE SIGNS LIST

1, 1A, 1B, 1C Radio frequency circuit
2 Antenna

3 RF signal processing circuit (RFIC)
4 Communication device
10, 20 Power amplifier
11, 21 Preamplifier
12, 12a, 12b, 22, 22a, 22b Phase shift line
12c, 22c, 123, 133, 143, 153, 231, 232, 241, 242 Capacitor
13, 14 Phase shift circuit
31, 32 Transformer
40, 41, 42, 60, 121, 122, 131, 132, 141, 142, 151, 152 Switch
50 Bias circuit
51, 52, 53, 54 Bias supply circuit
61, 62, 63, 64 Filter
71, 72, 73, 74, 120, 130, 140, 150 Matching circuit
76, 77 Output terminal
80, 81 Semiconductor IC
90 Module substrate
100 Antenna connection terminal
110 Input terminal
124, 134, 144, 154, 233, 234, 243, 244 Inductor
160 IC
172, 173, 174, 175 Terminal
311, 321 Input-side coil
312, 322 Output-side coil

The invention claimed is:

1. A radio frequency circuit comprising:
a first amplification element and a second amplification element;
an output transformer having an input-side coil and an output-side coil;
a bias circuit connected to the first amplification element and the second amplification element;
a first output terminal connected to one end of the output-side coil;
a second output terminal connected to another end of the output-side coil;
a first switch connected between the first output terminal and a ground;
a second switch connected between the second output terminal and the ground;
a first phase shift circuit having an input end connected to an output terminal of the first amplification element and an output end connected to one end of the input-side coil; and
a second phase shift circuit having an input end connected to an output terminal of the second amplification element and an output end connected to another end of the input-side coil.

2. The radio frequency circuit according to claim 1, wherein the bias circuit includes
a first bias circuit that changes a first bias voltage supplied to the first amplification element in synchronization with a timing of switching between conduction and non-conduction of the first switch and the second switch, and
a second bias circuit that changes a second bias voltage supplied to the second amplification element in synchronization with the timing of switching between the conduction and the non-conduction of the first switch and the second switch, and
a voltage value of the first bias voltage is different from a voltage value of the second bias voltage.

3. The radio frequency circuit according to claim 2, further comprising:
a first filter connected to the first output terminal and having a pass band including a first band; and a second filter connected to the second output terminal and having a pass band including a second band.

4. The radio frequency circuit according to claim 2, further comprising:
a first filter having a pass band including a first band;
a second filter having a pass band including a second band;
a third filter having a pass band including a third band;
a first circuit connected between the first output terminal and the first filter;
a second circuit connected between the second output terminal and the second filter; and
a third circuit connected between the first output terminal and the third filter,
wherein the first circuit includes
a first capacitor disposed in series in a first path that connects the first output terminal and the first filter to each other,
the first switch connected between the first path and a ground, and
a third switch and a first inductor connected to each other in series,
a series connection circuit of the third switch and the first inductor is connected to the first path in parallel,
the second circuit includes
the second switch connected between a second path that connects the second output terminal and the second filter to each other and a ground,
the third circuit includes
a second capacitor disposed in series in a third path that connects the first output terminal and the third filter to each other, and
a fourth switch and a second inductor connected to each other in series, and
a series connection circuit of the fourth switch and the second inductor is connected to the third path in parallel.

5. The radio frequency circuit according to claim 4, wherein, of the first capacitor and the first switch, the first capacitor is connected closer to the first output terminal.

6. The radio frequency circuit according to claim 5, further comprising:
a fourth filter having a pass band including a fourth band; and
a fourth circuit connected between the second output terminal and the fourth filter,
wherein the second circuit further includes
a third capacitor disposed in series in the second path, and
a fifth switch and a third inductor connected to each other in series,
a series connection circuit of the fifth switch and the third inductor is connected to the second path in parallel,
the third circuit further includes
a sixth switch connected between the third path and a ground,
the fourth circuit includes
a fourth capacitor disposed in series in a fourth path that connects the second output terminal and the fourth filter to each other,
a seventh switch connected between the fourth path and a ground, and
an eighth switch and a fourth inductor connected to each other in series, and a series connection circuit of the eighth switch and the fourth inductor is connected to the fourth path in parallel.

7. The radio frequency circuit according to claim 6, wherein the first amplification element and the second amplification element are different in size from each other.

8. The radio frequency circuit according to claim 7, wherein the first phase shift circuit includes a fifth capacitor connected to the output terminal of the first amplification element, a sixth capacitor connected in series to the fifth capacitor between the output terminal of the first amplification element and the one end of the input-side coil, a fifth inductor connected between a ground and a connection point of the fifth capacitor and the sixth capacitor, and a sixth inductor connected between a ground and a connection point of the sixth capacitor and the one end of the input-side coil.

9. The radio frequency circuit according to claim 8, wherein the second phase shift circuit includes a seventh capacitor connected to the output terminal of the second amplification element, an eighth capacitor connected in series to the seventh capacitor between the output terminal of the second amplification element and the other end of the input-side coil, a seventh inductor connected between a ground and a connection point of the seventh capacitor and the eighth capacitor, and an eighth inductor connected between a ground and a connection point of the eighth capacitor and the other end of the input-side coil.

10. The radio frequency circuit according to claim 7, wherein the first phase shift circuit includes a first phase shift line and a second phase shift line, and a ninth capacitor, one end of the first phase shift line is connected to the output terminal of the first amplification element, another end of the first phase shift line is connected to one end of the second phase shift line, and another end of the second phase shift line is connected to the one end of the input-side coil, and one end of the ninth capacitor is connected to a connection point of the other end of the first phase shift line and the one end of the second phase shift line, and another end of the ninth capacitor is connected to a ground.

11. The radio frequency circuit according to claim 10, wherein the second phase shift circuit includes a third phase shift line and a fourth phase shift line, and a tenth capacitor, one end of the third phase shift line is connected to the output terminal of the second amplification element, another end of the third phase shift line is connected to one end of the fourth phase shift line, and another end of the fourth phase shift line is connected to the other end of the input-side coil, and one end of the tenth capacitor is connected to a connection point of the other end of the third phase shift line and the one end of the fourth phase shift line, and another end of the tenth capacitor is connected to a ground.

12. The radio frequency circuit according to claim 11, further comprising:

a module substrate, wherein the first amplification element and the second amplification element are included in a semiconductor IC disposed on a main surface of the module substrate, and the ninth capacitor and the tenth capacitor are included in the semiconductor IC.

13. The radio frequency circuit according to claim 11, further comprising:

a module substrate, wherein the first phase shift circuit includes at least a fifth phase shift line, the second phase shift circuit includes at least a sixth phase shift line, the input-side coil, the output-side coil, the fifth phase shift line, and the sixth phase shift line are composed of a plane conductor that is formed on a surface of the module substrate or inside the module substrate, and a winding direction of the fifth phase shift line is the same as a winding direction of the sixth phase shift line based on the module substrate being viewed in a plan view.

14. A communication device comprising:

a signal processing circuit which processes a radio frequency signal; and the radio frequency circuit according to claim 1, which transmits the radio frequency signal between the signal processing circuit and an antenna.

15. The radio frequency circuit according to claim 1, further comprising:

a first filter connected to the first output terminal and having a pass band including a first band; and a second filter connected to the second output terminal and having a pass band including a second band.

16. The radio frequency circuit according to claim 1, further comprising:

a first filter having a pass band including a first band;

a second filter having a pass band including a second band;

a third filter having a pass band including a third band;

a first circuit connected between the first output terminal and the first filter;

a second circuit connected between the second output terminal and the second filter; and a third circuit connected between the first output terminal and the third filter, wherein the first circuit includes a first capacitor disposed in series in a first path that connects the first output terminal and the first filter to each other, the first switch connected between the first path and a ground, and a third switch and a first inductor connected to each other in series, a series connection circuit of the third switch and the first inductor is connected to the first path in parallel, the second circuit includes the second switch connected between a second path that connects the second output terminal and the second filter to each other and a ground, the third circuit includes a second capacitor disposed in series in a third path that connects the first output terminal and the third filter to each other, and a fourth switch and a second inductor connected to each other in series, and a series connection circuit of the fourth switch and the second inductor is connected to the third path in parallel.

17. The radio frequency circuit according to claim 16, wherein, of the first capacitor and the first switch, the first capacitor is connected closer to the first output terminal.

18. The radio frequency circuit according to claim 17, further comprising:

a fourth filter having a pass band including a fourth band; and a fourth circuit connected between the second output terminal and the fourth filter, wherein the second circuit further includes a third capacitor disposed in series in the second path, and a fifth switch and a third inductor connected to each other in series, a series connection circuit of the fifth switch and the third inductor is connected to the second path in parallel, the third circuit further includes a sixth switch connected between the third path and a ground, the fourth circuit includes a fourth capacitor disposed in series in a fourth path that connects the second output terminal and the fourth filter to each other, a seventh switch connected between the fourth path and a ground, and an eighth switch and a fourth inductor connected to each other in series, and a series connection circuit of the eighth switch and the fourth inductor is connected to the fourth path in parallel.

19. A power amplification method for a radio frequency circuit including:

a first amplification element and a second amplification element;

an output transformer having an input-side coil and an output-side coil;

a bias circuit connected to the first amplification element and the second amplification element;

a first output terminal connected to one end of the output-side coil;

a second output terminal connected to another end of the output-side coil;

a first switch connected between the first output terminal and a ground;

a second switch connected between the second output terminal and the ground;

a first phase shift circuit having an input end connected to an output terminal of the first amplification element and an output end connected to one end of the input-side coil; and a second phase shift circuit having an input end connected to an output terminal of the second amplification element and an output end connected to another end of the input-side coil, the method comprising:

supplying a first bias voltage from the bias circuit to the first amplification element, and supplying a second bias voltage having a smaller voltage value than the first bias voltage from the bias circuit to the second amplification element, based on the first switch being in a non-conductive state and the second switch being in a conductive state; and supplying the first bias voltage from the bias circuit to the first amplification element, and supplying the second bias voltage having a larger voltage value than the first bias voltage from the bias circuit to the second amplification element, based on the first switch being in the conductive state and the second switch being in the non-conductive state.

20. A power amplification method for a radio frequency circuit including:

a first amplification element and a second amplification element;

an output transformer having an input-side coil and an output-side coil;

a first output terminal connected to one end of the output-side coil;

a second output terminal connected to another end of the output-side coil;

a first switch connected between the first output terminal and a ground;

a second switch connected between the second output terminal and the ground;

a first phase shift circuit having an input end connected to an output terminal of the first amplification element and an output end connected to one end of the input-side coil; and a second phase shift circuit having an input end connected to an output terminal of the second amplification element and an output end connected to another end of the input-side coil, the method comprising:

operating the first amplification element in class AB or class A, and operating the second amplification element in class C, based on the first switch being in a non-conductive state and the second switch being in a conductive state; and operating the first amplification element in class C, and operating the second amplification element in class AB or class A, based on the first switch being in the conductive state and the second switch being in the non-conductive state.

* * * * *